(12) United States Patent
Wu et al.

(10) Patent No.: US 11,948,886 B2
(45) Date of Patent: Apr. 2, 2024

(54) SEMICONDUCTOR DEVICE AND METHODS OF MANUFACTURING SAME

(71) Applicant: TAIWAN SEMICONDUCTOR MANUFACTURING COMPANY, LTD., Hsinchu (TW)

(72) Inventors: Guo-Huei Wu, Hsinchu (TW); Hui-Zhong Zhuang, Hsinchu (TW); Chih-Liang Chen, Hsinchu (TW); Li-Chun Tien, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/244,058

(22) Filed: Apr. 29, 2021

(65) Prior Publication Data

US 2022/0130760 A1    Apr. 28, 2022

Related U.S. Application Data

(60) Provisional application No. 63/104,610, filed on Oct. 23, 2020.

(51) Int. Cl.
*H01L 23/528* (2006.01)
*H01L 21/8234* (2006.01)
*H01L 29/06* (2006.01)

(52) U.S. Cl.
CPC .. *H01L 23/5286* (2013.01); *H01L 21/823475* (2013.01); *H01L 29/0696* (2013.01)

(58) Field of Classification Search
CPC ......... H01L 23/49822; H01L 23/49827; H01L 23/49816; H01L 23/5226; H01L 23/5286;
(Continued)

(56) References Cited

U.S. PATENT DOCUMENTS

| 7,260,442 B2 | 8/2007 | Hwang et al. |
| 9,256,709 B2 | 2/2016 | Yu et al. |

(Continued)

FOREIGN PATENT DOCUMENTS

| DE | 102019127073 | 3/2021 |
| TW | 201719855 | 6/2017 |

(Continued)

OTHER PUBLICATIONS

Office Action dated May 17, 2022 for corresponding case No. DE 10 2021 111 423.3. (p. 1).

(Continued)

*Primary Examiner* — Natalia A Gondarenko
(74) *Attorney, Agent, or Firm* — Hauptman Ham, LLP

(57) ABSTRACT

A semiconductor device includes one or more active semiconductor components, wherein a front side is defined over the semiconductor substrate and a back side is defined beneath the semiconductor substrate. A front side power rail is formed at the front side of the semiconductor device and is configured to receive a first reference power voltage. First and second back side power rails are formed on the back side of the semiconductor substrate and are configured to receive corresponding second and third reference power voltages. The first, second and third reference power voltages are different from each other.

20 Claims, 23 Drawing Sheets

(58) Field of Classification Search
CPC ............ H01L 23/5283; H01L 23/5386; H01L 21/823475; H01L 21/76877; H01L 21/31144; H01L 21/4853; H01L 29/0692; H01L 29/0696; H01L 29/401; H01L 29/4175; H01L 27/088; H01L 27/11803; H01L 27/11898; H01L 25/50; H01L 25/0657; G06F 17/50; G06F 17/5081; G06F 17/5068; G06F 17/5077
USPC .......................................... 257/666, 737, 778
See application file for complete search history.

(56) References Cited

U.S. PATENT DOCUMENTS

| | | | |
|---|---|---|---|
| 2002/0020862 A1 | 2/2002 | Livengood et al. | |
| 2014/0040838 A1 | 2/2014 | Liu et al. | |
| 2014/0246791 A1 | 9/2014 | Stephens et al. | |
| 2015/0278429 A1 | 10/2015 | Chang | |
| 2018/0145070 A1* | 5/2018 | Fan | H01L 21/823475 |
| 2019/0267316 A1 | 8/2019 | Nelson et al. | |
| 2020/0019671 A1 | 1/2020 | Lin et al. | |
| 2020/0020591 A1 | 1/2020 | Anderson et al. | |
| 2021/0082815 A1 | 3/2021 | Doornbos | |
| 2022/0058326 A1* | 2/2022 | Lee | G06F 30/392 |
| 2022/0068346 A1* | 3/2022 | Chen | G11C 11/4094 |
| 2022/0068906 A1* | 3/2022 | Chava | H01L 23/522 |
| 2022/0077134 A1* | 3/2022 | Chen | H01L 27/092 |
| 2022/0084561 A1* | 3/2022 | Chen | G11C 8/08 |
| 2022/0123751 A1* | 4/2022 | Thyagarajan | H03K 19/0016 |

FOREIGN PATENT DOCUMENTS

| | | |
|---|---|---|
| TW | 202022990 | 6/2020 |
| WO | 2020092361 | 5/2020 |

OTHER PUBLICATIONS

Office Action dated May 20, 2022 for corresponding case No. TW 11120499520. (pp. 1-6).

\* cited by examiner

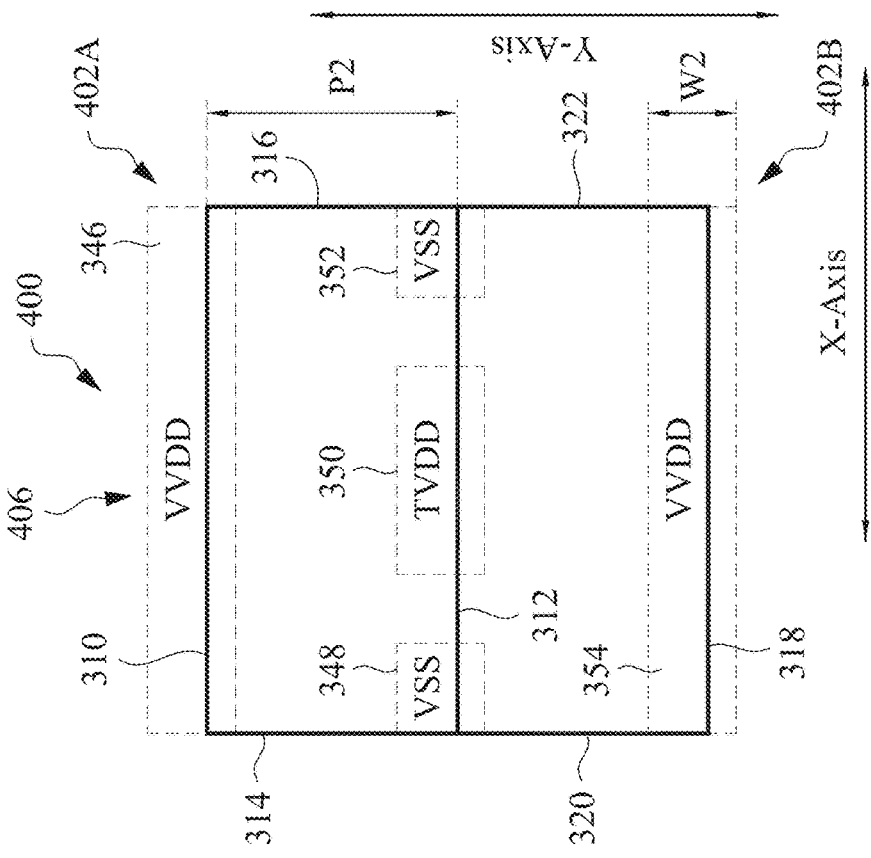
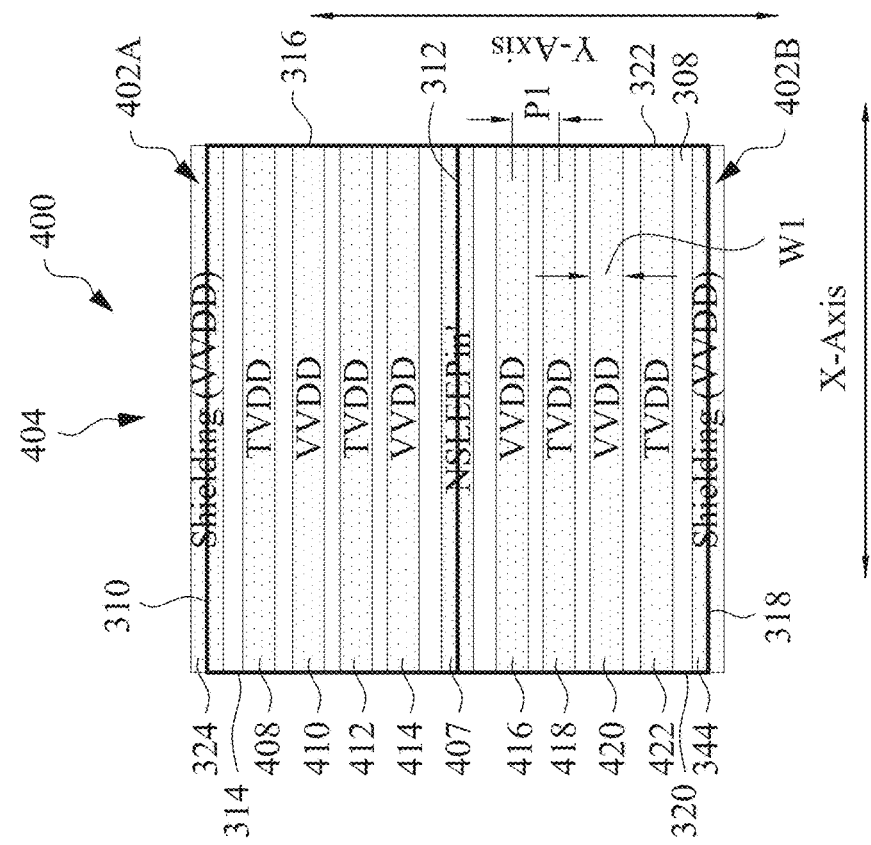
FIG. 4B
FIG. 4A

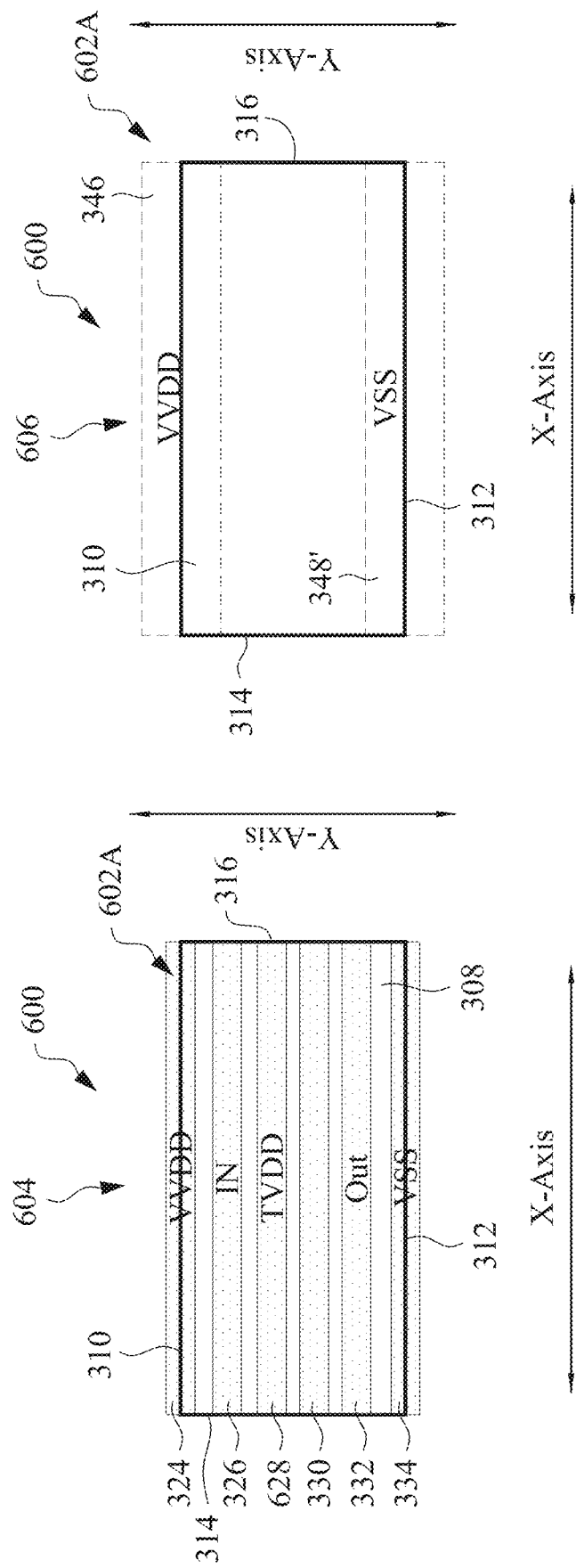

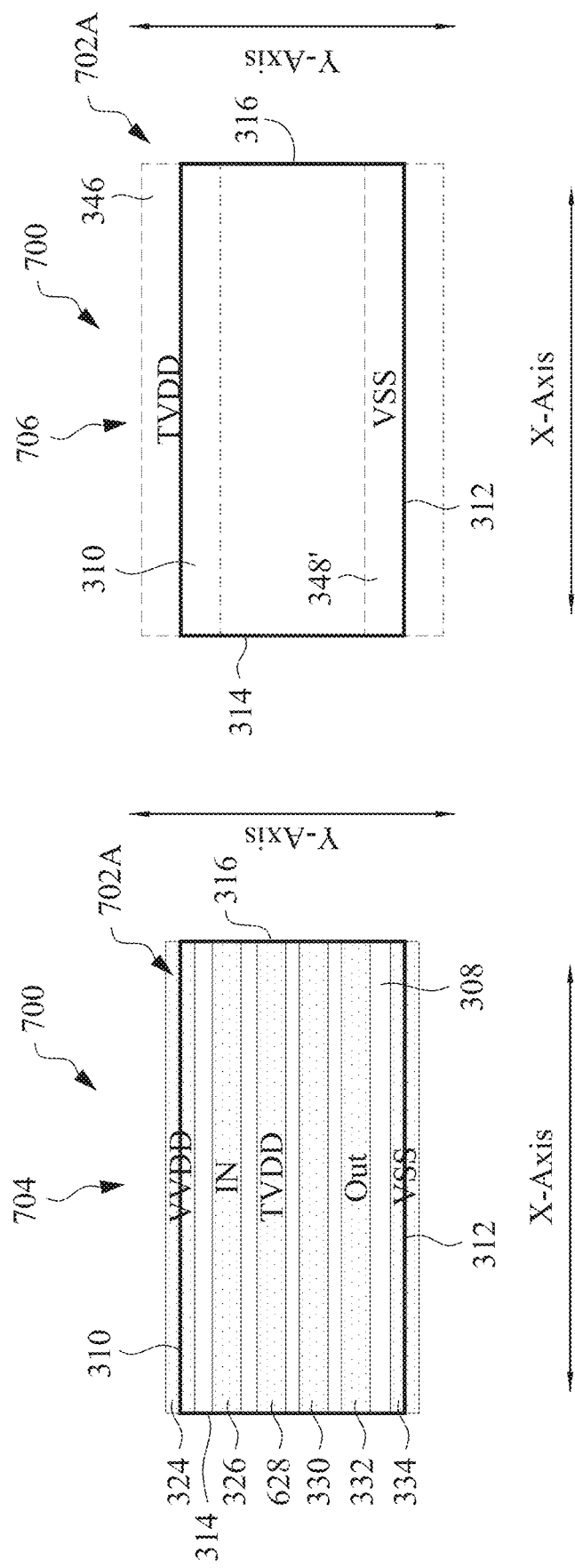

SEMICONDUCTOR DEVICE AND METHODS OF MANUFACTURING SAME

PRIORITY CLAIM

The present application claims the priority of U.S. Provisional Application No. 63/104,610, filed Oct. 23, 2020, which is incorporated herein by reference in its entirety.

BACKGROUND

The semiconductor integrated circuit (IC) industry has produced a wide variety of analog and digital devices to address issues in a number of different areas. As ICs have become smaller and more complex, operating voltages of these analog and digital devices are reduced affecting the operating voltages of these digital devices and overall IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A and FIG. 4B are corresponding layout diagrams that illustrate abutting cells, in accordance with some embodiments.

FIG. 6A and FIG. 6B are corresponding layout diagrams that illustrate a cell, in accordance with some embodiments.

FIG. 7A and FIG. 7B are corresponding layout diagrams that illustrate a cell, in accordance with some embodiments.

DETAILED DESCRIPTION

Figure 1A:
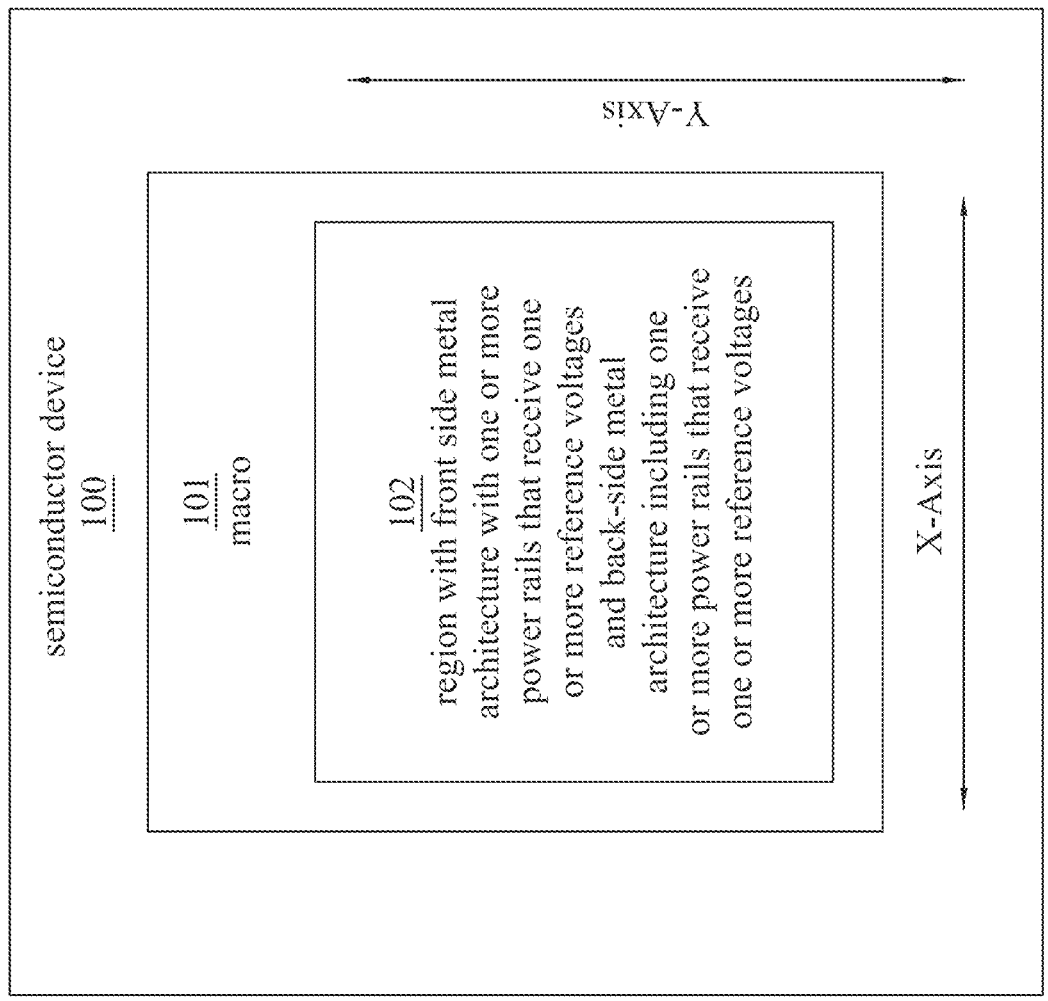
FIG. 1A is a block diagram of a semiconductor device, in accordance with an embodiment of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a semiconductor device includes one or more active semiconductor components, wherein a front side is defined over a semiconductor substrate and a back side is defined beneath the semiconductor substrate, i.e., on the side opposite the front side. In some embodiments, one or more front side power rails are formed at the front side of the semiconductor substrate and one or more back side power rails are formed on the back side of the semiconductor substrate. Different reference voltages are distributed to the active semiconductor components through the front side power rails and/or the back side power rails. For example, reference voltages such as a gated version of VDD (herein referred to as VVDD), an ungated version of VDD (herein referred to as true VDD or TVDD), and VSS (e.g., ground) are received by one or more of the front side power rails and/or one or more of the back side power rails to distribute the three different reference voltages VDD, VVDD, and TVDD to cell regions on the semiconductor substrate. In general, reducing the congestion of power rails in order to distribute different operating voltages without creating large amounts of noise helps to reduce the size of circuitry of an IC. Accordingly, in some embodiments, the front side power rails and back side power rails help reduce power rail congestion and reduce noise thereby facilitating reduction in size of the active semiconductor components on the semiconductor substrate.

FIG. 1A is a block diagram of a semiconductor device 100 in accordance with an embodiment of the present disclosure.

In FIG. 1A, semiconductor device 100 includes, among other things, a circuit macro (hereinafter, macro) 101. In some embodiments, macro 101 is a header circuit. In some embodiments, macro 101 is a macro other than a header circuit. Macro 101 includes, among other things, a region 102 with a front side metal architecture with one or more front side power rails configured to receive one or more reference voltages and a back side metal architecture including one or more back side power rails configured to receive one or more reference voltages. In some embodiments, at least some of the reference voltages received by the front side conductive rails and at least some of the reference voltages received by the back side conductive rails are the same. In other embodiments, the reference voltages received by the front side conductive rails and the reference voltages received by the back side conductive rails are the same. In still other embodiments, the reference voltages received by the front side power rails and the reference voltages received by the hack side power rails are all different. As explained below, conductive fingers increase the area available for making connections to conductive segments which supply different voltages in a power-gating scheme. Region 102 includes metal layers and interconnection layers above the semiconductor substrate, where "above" is relative to the Z-axis (not shown in FIG. 1A). Region 102 also includes metal layers and interconnection layers beneath the semiconductor substrate, where "beneath" is relative to the Z-direction (not shown in FIG. 1A), which are also referred to as back metal layers and back vias. Front side power rails are formed in the front side metal layers above the semiconductor substrate while back side power rails are formed in the metal layers beneath the semiconductor substrate.

In some embodiments, in the region 102, the front side power rails and the back side power rails are configured to receive different reference voltages (e.g., GND, VVDD, TVDD). By distributing power on the front side and the back side of the semiconductor substrate, cell height is reduced and area consumed by a circuit is reduced, in some embodiments. Also, in some embodiments, distributing power on the front side and the back side of the semiconductor substrate reduces electromigration susceptibility, parasitic capacitance and internal resistance thereby making corresponding designs more power efficient.

Figure 1B:
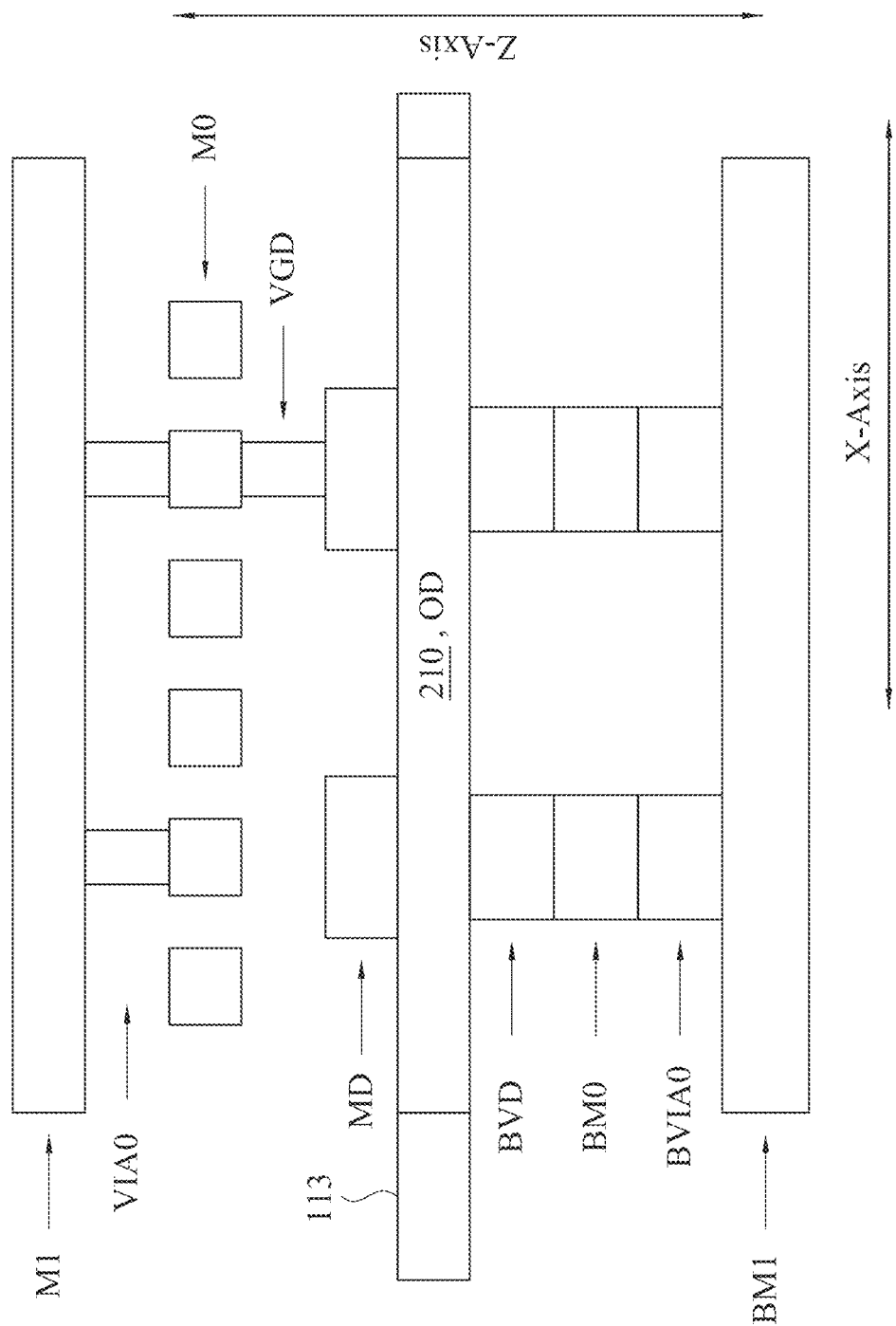
FIG. 1B is a cross-section, in accordance with some embodiments.

FIG. 1B is a cross-section, in accordance with some embodiments.

More particularly, FIG. 1B illustrates a cross sectional area of a region of a semiconductor device, such as the region 102 of the semiconductor device 100 shown in FIG. 1A.

The cross-section of FIG. 1B includes the semiconductor substrate 113, contact-to-transistor-component layer (layer BVD), back metal layer BM0, back via layer BVIA0, and back metal layer BM1. Also shown are a metal-to-drain/source layer (MD layer), a via-to-gate/MD layer (VGD layer), a metal layer M0, via layer VIA0, and a metal layer M1. In some embodiments, the VGD layer is referred to as a via-to-MD layer (VD layer). From top to bottom relative to a Z-axis, metal layer M1, via layer VIA0, metal layer M0, VGD layer, MD layer, semiconductor substrate 113, layer BVD, back metal layer BM0, back via layer BVIA0, and back metal layer BM1 form a stack of layers. The Z-axis is orthogonal to both the X-axis and the Y-axis (for the latter, see FIG. 1A).

In FIG. 1B, MO represents a first metallization layer on the front side, correspondingly the first layer of interconnection on the front side is VIA0, BM0 represents a first metallization layer on the back side, and correspondingly the first layer of interconnection on the back side is BVIA0. In some embodiments, depending upon the numbering convention of the corresponding process node by which such a semiconductor device is fabricated, the first layer of metallization on the front side is M1, correspondingly the first layer of interconnection VIA1, the first layer of metallization on the back side is BM1, and correspondingly the first layer of interconnection on the back side is BVIA1. In some embodiments, M0 is the first layer of metallization above a transistor layer (which includes semiconductor layer 113) in which transistors are formed, and BM0 is the first layer of metallization below the transistor layer.

As shown in FIG. 1B, metal layer M1, via layer VIA0, metal layer M0, VGD layer and MD layer are stacked over semiconductor substrate 113. Active (OD) regions 210 are formed in semiconductor substrate 113. Because metal layer M1, via layer VIA0, metal layer M0, VGD layer, and MD layer are stacked above semiconductor substrate 113, they are referred to as "front side" layers. Layer BVD, back metal layer BM0, back via layer BVIA0, and back metal layer BM1 are stacked beneath semiconductor substrate 113 in that order from top to bottom, i.e., from the closest to the farthest from the semiconductor substrate 113. Because layer BVD, back metal layer BM0, back via layer BVIA0, and back metal layer BM1 are stacked beneath semiconductor substrate 113, they are referred to as "back side" layers.

Figure 2:
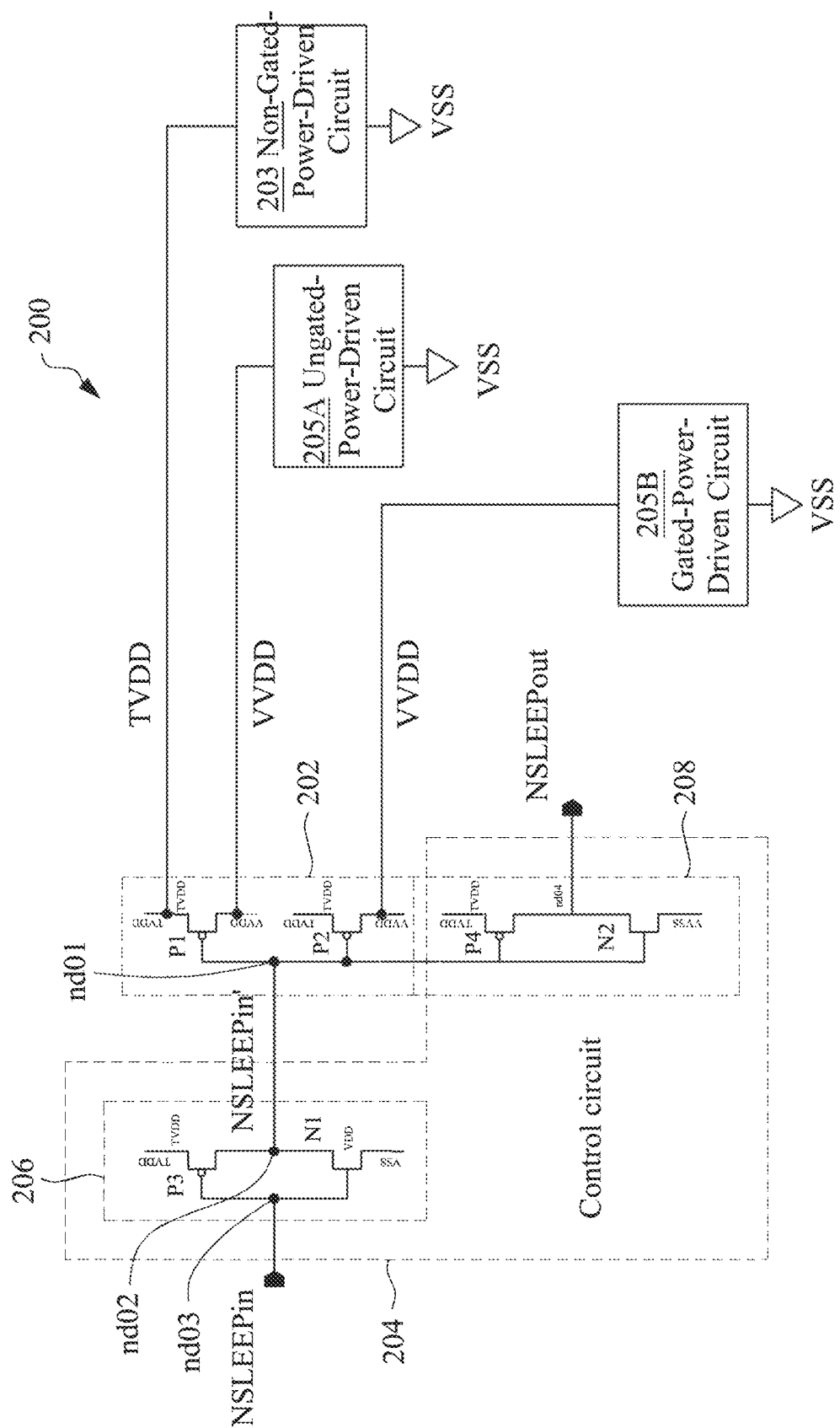
FIG. 2 is an integrated circuit (IC) circuit, in accordance with some embodiments.

FIG. 2 is an integrated circuit (IC) circuit 200, in accordance with some embodiments.

IC 200 is an example of a circuit usable in region 102 described above. As such, IC 200 is one example of a circuit that benefits from using a front side metal architecture and a back side metal architecture including power rails configured to receive different reference voltages.

IC 200 includes: a header circuit 202; a control circuit 204; an ungated-power-driven circuit 203; a gated-power-driven circuit 205A; and a gated-power-driven circuit 205B. In general, power consumption by a circuit increases due to leakage currents. Power gating is a technique to reduce power consumption in circuits within an IC by turning off power supplied to circuits within the IC which are not being used. The power supplied to each of gated-power-driven circuits 205A and 205B is gated by corresponding portions of header circuit 202, hence each of circuits 205A and 205B is referred to herein as a gated-power-driven circuit. The power supplied to ungated-power-driven circuit 203 is not gated by a corresponding header circuit; hence, circuit 203 is referred to herein as an ungated-power-driven circuit.

Each of gated-power-driven circuits 205A and 205B is a type of circuit which is configured to operate in a normal mode, and in a sleep mode (the latter also being referred to as a standby mode), or the like. In the normal mode, power is supplied to each of gated-power-driven circuits 205A and 205B. In the normal mode, each of gated-power-driven circuits 205A and 205B is used by IC 200 and is either active or inactive, with more power being consumed when active than when inactive. Though less power is consumed when each of gated-power-driven circuits 205A and 205B is in use albeit inactive, nevertheless significant power is consumed due to leakage currents. In the sleep mode, each of gated-power-driven circuits 205A and 205B is not being used and so power is not supplied to each of gated-power-driven circuits 205A and 205B. Accordingly, in the sleep mode, each of gated-power-driven circuits 205A and 205B not only is inactive, but each of circuits 205A and 205B also does not suffer leakage currents. In some embodiments, the sleep mode is referred to as a standby mode. A more detailed description of a header circuit and its relation to a gated-power-driven circuit and an ungated-power-driven circuit is found in U.S. Patent Publication No. 20200019671A1, filed Jul. 2, 2019, entitled "Integrated Circuit and Method of Forming the Same," which is incorporated herein by reference in its entirety.

Header circuit 202 includes a PMOS transistor P1 and a PMOS transistor P2. A source of PMOS transistor P1 and a source of PMOS transistor P2 are both configured to receive an ungated version of a reference voltage, e.g., VDD. In FIG. 2, the ungated version of VDD is referred to as true VDD (TVDD). Furthermore, a body contact of PMOS transistor P1 and a body contact of PMOS transistor P2 are configured to receive ungated reference voltage TVDD. When transistors P1 and P2 correspondingly are turned on, a drain of PMOS transistor P1 and a drain of PMOS transistor P2 supply a gated version of TVDD correspondingly to gated-power-driven circuits 205A and 205B. The gated version of TVDD is referred to as virtual VDD (VVDD) in FIG. 2. Assuming that a source-drain voltage drop (Vsd) for each of transistors P1 and P2 is sufficiently small as to be regarded as negligible, VVDD=TVDD−Vsd≈TVDD, and thus VVDD is substantially similar to TVDD. When transistors P1 and P2 correspondingly are turned OFF, power is cut off correspondingly to gated-power-driven circuits 205A and 205B.

A gate of PMOS transistor P1 and a gate of PMOS transistor P2 are both connected to a node nd01 and are configured to receive a control signal NSLEEPin'. Header circuit 202 is, and more particularly each of transistors P1 and P2 is, configured to be turned on and off based on control signal NSLEEPin'. It should be noted that header circuit 202 may have a different configuration than the embodiment shown in FIG. 2. For example, in some alternative embodiments, header circuit 202 has a single PMOS transistor, e.g., P1, which supplies VVDD to each of gated-power-driven circuits 205A and 205B. In such an alternative embodiment in which the current-sourcing capacity of transistor P1 is sufficient to source each of gated-power-driven circuits 205A and 205B, the use of single transistor P1 reduces the area consumed by header circuit 202.

Control circuit 204 includes a first inverter 206 and a second inverter 208. First inverter 206 is configured receive a control signal NSLEEPin and to invert the same so as to generate control signal NSLEEPin'. Thus, if control signal NSLEEPin is received in a high voltage state (e.g., at or near TVDD), then first inverter 206 is configured to generate control signal NSLEEPin' at a low voltage state (e.g., at or near VSS). If control signal NSLEEPin is received in a low voltage state (e.g., at or near VSS), then first inverter 206 is configured to generate control signal NSLEEPin' at a high voltage state (e.g., at or near TVDD).

In this embodiment, first inverter 206 includes a PMOS transistor P3 and an NMOS transistor N1. PMOS transistor P3 has a source connected to receive ungated reference voltage TVDD and a drain connected to node nd02. A body contact of PMOS transistor P3 is connected to receive ungated reference voltage TVDD. Node nd02 is connected to node nd01 of circuit 202. NMOS transistor N1 has a drain connected to node nd02 and a source connected to receive a reference voltage VSS (e.g., a ground voltage). A body contact of NMOS transistor N1 is connected to receive a reference voltage VBB. A gate contact of PMOS transistor P3 and a gate contact of NMOS transistor N1 are both connected to node nd03. Control signal NSLEEPin is received at node nd03.

Accordingly, if control signal NSLEEPin is received in a low voltage state (e.g., at or near VSS), PMOS transistor P3 turns on and NMOS transistor N1 shuts off. PMOS transistor P3 thus pulls the voltage at node nd02 up at or near TVDD so that control signal NSLEEPin' is supplied at or near TVDD. As such, the voltage at node nd01 is in the high voltage state at or near TVDD. Accordingly, PMOS transistor P1 and PMOS transistor P2 are shut off and thus power is cut off correspondingly to gated-power-driven circuits 205A and 205B.

On the other hand, if control signal NSLEEPin is in a high voltage state (at or near TVDD), PMOS transistor P3 shuts off and NMOS transistor N1 turns on. NMOS transistor N1 thus pulls the voltage at node nd02 down at or near VSS so that control signal NSLEEPin' is at or near VSS. As such, node nd01 is in the low voltage state at or near VSS. Accordingly, PMOS transistor P1 and PMOS transistor P2 are turned on to supply gated reference voltage VVDD to gated-power-driven circuits 205A and 205B.

Second inverter 208 is configured to generate control signal NSLEEPout from control signal NSLEEPin'. More specifically, second inverter 208 is configured to invert control signal NSLEEPin' and generate control signal NSLEEPout. Thus, if control signal NSLEEPin' is received in a high voltage state (e.g., at or near TVDD) second inverter 208 is configured to generate control signal NSLEEPout at a low voltage state (e.g., at or near VSS). If control signal NSLEEPin' is received in a low voltage state (e.g., at or near VSS), second inverter 208 is configured to generate control signal NSLEEPout at a high voltage state (e.g., at or near TVDD).

In this embodiment, second inverter 208 includes a PMOS transistor P4 and an NMOS transistor N2. PMOS transistor P4 has a source connected to receive ungated reference voltage TVDD and a drain connected to node nd04. A body contact of PMOS transistor P4 is connected to receive ungated reference voltage TVDD. NMOS transistor N2 has a drain connected to node nd04 and a source connected to receive a reference voltage VSS (e.g., a ground voltage). A body contact of NMOS transistor N2 is connected to receive reference voltage VBB. A gate contact of PMOS transistor P4 and a gate contact of NMOS transistor N2 are both connected to node nd01. Control signal NSLEEPin' is supplied at node nd01.

Accordingly, if control signal NSLEEPin' is in a low voltage state (e.g., at or near VSS), then PMOS transistor P4 turns on and NMOS transistor N2 shuts off. PMOS transistor P4 thus pulls the voltage at node nd04 up at or near TVDD so that control signal NSLEEPout is at or near TVDD. As such, the voltage at node nd04 is in the high voltage state at or near TVDD. In this manner, control signal NSLEEPout indicates that header circuit 202 is turned on and is providing gated control voltage VVDD to gated-power-driven circuits 205A and 205B.

On the other hand, if control signal NSLEEPin' is in a high voltage state (at or near TVDD), then PMOS transistor P4 shuts off and NMOS transistor N2 turns on. NMOS transistor N2 thus pulls the voltage at node nd04 down at or near VSS so that control signal NSLEEPout is in the low voltage state at or near VSS. In this manner, control signal NSLEEPout indicates that header circuit 202 is turned off so that power is cut off to each of gated-power-driven circuits 205A and 205B.

Figure 3B:
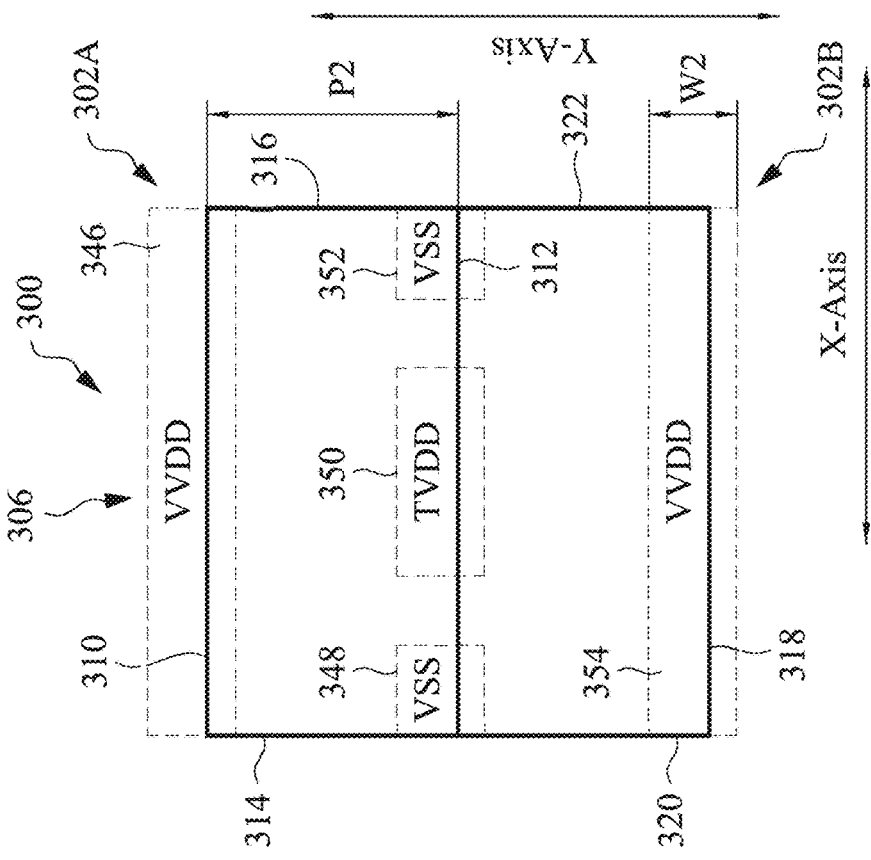
FIG. 3A and FIG. 3B are corresponding layout diagrams that illustrate a cell, in accordance with some embodiments.
Figure 3A:
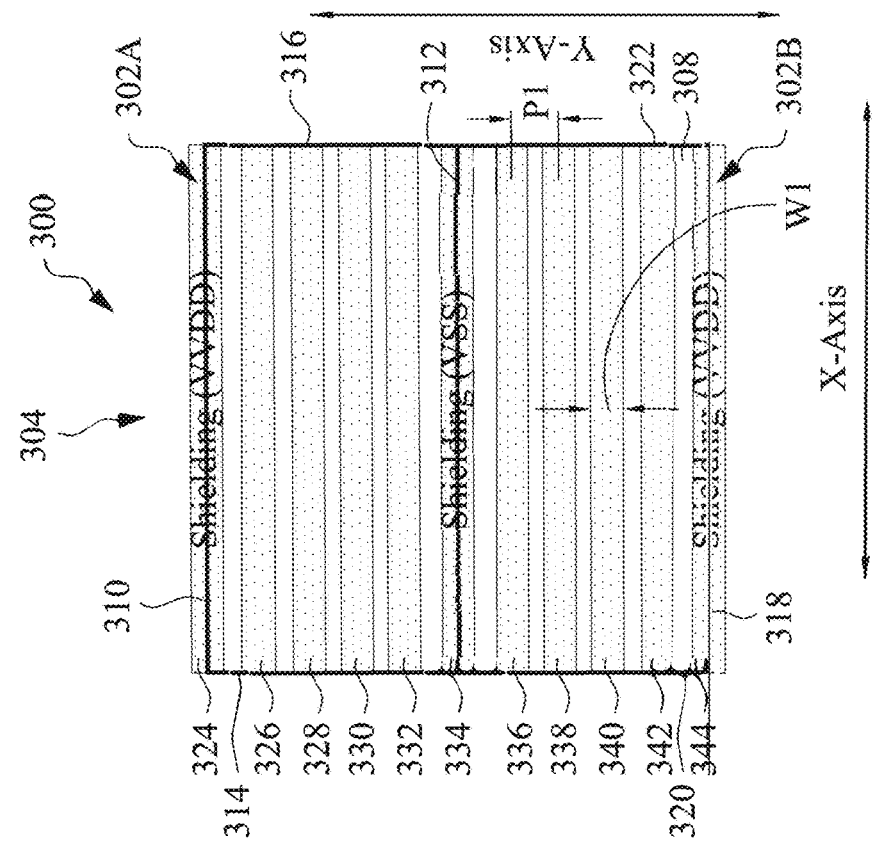

FIG. 3A and FIG. 3B are corresponding layout diagrams 300 that illustrate cell 302A and cell 302B, in accordance with some embodiments.

Cell 302A and cell 302B are representations of one embodiment of region 102 in semiconductor device 100. FIG. 3A illustrates a front side 304 of layout diagram 300 and FIG. 3B illustrates a back side 306 of layout diagram 300. Front side 304 is above a semiconductor substrate 308 and back side 306 is beneath semiconductor substrate 308.

The layout diagrams of FIGS. 3A-3B are representative of a semiconductor device. Structures in the semiconductor device are represented by patterns (also known as shapes) in the layout diagram. For simplicity of discussion, elements in the layout diagrams of FIGS. 3A-3B (and of other layout diagrams included herein) will be referred to as if they are structures rather than patterns per se. For example, pattern 210 represents an active region. In some embodiments, an active regions is referred to as an oxide-dimensioned (OD) regions. In the following discussion, element 336 is referred to as a front side conduction line 336 rather than as front side conductive pattern 336.

For simplicity of illustration, FIG. 3A shows structures in semiconductor substrate 308 and structures in metal layer M0, but no structures in other layers. Also for simplicity of illustration, FIG. 3B shows structures in layer BM0, but no structures in other layers.

In this embodiment, cell 302A includes a top boundary 310 and a bottom boundary 312 that extend in a first direction that is parallel to the X-axis. A left boundary 314 and a right boundary 316 that extend in a second direction that is parallel to the Y-axis. As such, first direction and second direction are orthogonal to one another.

In this embodiment, cell 302B includes a top boundary 312 and a bottom boundary 318 that extend in the first direction. A left boundary 320 and a right boundary 322 extend in the second direction.

Cell 302A and cell 302B are adjacent to one another. Furthermore, note that bottom boundary 312 of cell 302A is the same as top boundary 312 of cell 302B. As such, cell 302A and cell 302B abut each other relative to boundary 312, and relative to the Y-axis.

Layout cell 302A is a dual-mode cell. A dual-mode cell (i.e., a gated-power-driven cell) is powered by VVDD and thus can be turned on and turned off by a header circuit, such as header circuit 202 shown in FIG. 2. Layout cell 302B is a single-mode cell (or ungated cell). A single-mode cell (i.e., an ungated-power-driven cell) is powered by TVDD and thus cannot be turned on and turned off by a header circuit. Rather, the single-mode cell is always being powered by TVDD, which cannot be turned on and turned off by a header circuit.

Power is distributed to abutting cells 302A and cell 302B through front side 304 of FIG. 3A and back side 306 of FIG. 3B.

On front side 304 of FIG. 3A, from top to bottom relative to the Y-axis, cell 302A includes a front side power rail 324, a front side conduction line 326, a front side conduction line 328, a front side conduction line 330, a front side conduction line 332, and a front side power rail 334.

On front side 304 of FIG. 3A, from top to bottom relative to the Y-axis, cell 302B includes front side power rail 334, a front side conduction line 336, a front side conduction line 338, a front side conduction line 340, a front side conduction line 342, and a front side power rail 344.

Each of front side conduction lines 326, 328, 330, 332, 336, 338, 340 and 342, and front side power rails 324, 334 and 344, has a long axis that extends in the first direction and a short axis that extends in the second direction. Furthermore, front side conduction lines 326, 328, 330, 332, 336, 338, 340 and 342, and front side power rails 324, 334 and 344, are parallel to one another in the first direction and are separated from each other by a pitch P1 relative to the Y-axis. Each of front side conduction lines 326, 328, 330, 332, front side conduction lines 336, 338, 340 and 342, and front side power rails 324, 334 and 344, has a width W1, where W1 is a length relative to the short axis of the structure, i.e., relative to the Y-axis. In some embodiments, each of front side conduction lines 326, 328, 330, 332, 336, 338, 340 and 342, and front side power rails 324, 334 and 344, is formed in the same metal layer such as a first metal layer or a second metal layer described above with respect to FIG. 1B. In some embodiments, W1 is equal to between approximately (0.4*P1) to (0.6*P1).

In FIG. 3A, relative to the Y-axis, a top half (i.e., a half-width) of front side power rail 324 is outside cell 302A and a bottom half (i.e., a half-width) of front side power rail 324 is within cell 302A. A line of demarcation between the top half of front side power rail 324 outside cell 302A and the bottom half of front side power rail 324 is top boundary 310. Front side power rail 324 is configured to receive reference voltage VVDD. However, front side power rail 324 is not used to distribute reference voltage VVDD to other components (not shown) of cell 302A. Instead, the presence of reference voltage VVDD on front side power rail 324 is used to shield cell 302A.

Relative to the X-axis, front side conduction lines 326, 328, 330, 332 each has a full width with respect to cell 302A, i.e., each extends from left side 314 to right side 316. In some embodiments, at least some of front side conduction lines 326, 328, 330, 332, and front side power rail 334 are configured to receive various signals, such as control signals, input signals, output signals, or the like. The various signals are distributed (or routed) through one or more of front side conduction lines 326, 328, 330, and 332 to semiconductor components (not shown) formed on semiconductor substrate 308.

In FIG. 3A, relative to the Y-axis, a top half of front side power rail 334 is within cell 302A and a bottom half of front side power rail 334 is within cell 302B. A line of demarcation between the top half of front side power rail and the bottom half of front side power rail 334 is bottom boundary 312. Front side power rail 334 is configured to receive reference voltage VSS (e.g., ground). However, front side power rail 334 is not used to distribute reference voltage VSS to other components (not shown) of cell 302A and cell 302B. Instead, the presence of reference voltage VSS on front side power rail 334 is used to shield cell 302A and cell 302B.

Each of front side conduction lines 336, 338, 340, 342 has a full width within cell 302B. In some embodiments, at least some of front side conduction lines 336, 338, 340, and 342 are configured to receive various signals, such as control signals, input signals, output signals, or the like. The various signals are distributed (or routed) through one or more of front side conduction lines 336, 338, 340, and 342 to semiconductor components (not shown) formed on semiconductor substrate 308.

In this embodiment, a top half of front side power rail 344 is within cell 302B and a bottom half of front side power rail 344 is outside cell 302B. A line of demarcation between the top half of front side power rail and the bottom half of front side power rail 344 is bottom boundary 318. Front side power rail 344 is configured to receive reference voltage VVDD. However, front side power rail 344 is not used to distribute reference voltage VVDD to cell 302B. Instead, front side power rail 344 is used to shield cell 302B.

Without connecting front side power rail 324, front side power rail 334, and front side power rail 344 to their corresponding reference voltages VVDD, VSS, front side conduction lines 336, 338, 340, 342 would suffer from decoupling capacitance and noise, in some embodiments. In some embodiments, connecting front side power rail 324, front side power rail 334, and front side power rail 344 to their corresponding reference voltages VVDD, VSS makes the signals on front side conduction lines 336, 338, 340, 342 more stable and provides better performance. In other embodiments, layout diagram 300 represents a circuit where the area of the circuit has to be minimized. In this case, front side power rails 324, 334, 344 are used to transmit signals and would thus be front side conduction lines 324, 334, 344.

In FIG. 3B, power distribution to the semiconductor components (not shown) in semiconductor substrate 308 is supplied at back side 306. Layout diagram 300 includes back side power rails 346, 348, 350, 352, and 354. Each of back side power rails 346, 348, 350, 352, and 354 has a long axis that extends in the first direction and a short axis that extends the second direction. Back side power rails 348, 350 and 352 are parallel to back side power rail 346 and back side power rail 354. However, relative to the Y-axis, each of back side power rails 348, 350 and 352 is between back side power rail 346 and back side power rail 354. Furthermore, back side power rails 348, 350 and 352 are substantially aligned with respect to the Y-axis but separated from one another relative to the X-axis. In this embodiment, relative to the X-axis, back side power rail 350 is between back side power rail 348 and back side power rail 352. Also, relative to the X-axis, back side power rail 348 is the leftmost back side power rail while back side power rail 352 is the rightmost back side power rail.

Relative to the Y-axis, each of back side power rails 348, 350 and 352 is separated from back side power rail 346 by a pitch P2. Additionally, relative to the Y-axis, each of back side power rails 348, 350 and 352 is separated from back side power rail 354 by pitch P2. In this embodiment, pitch P2 is approximately equal to the cell height of one of cells 302A, 302B. Each of back side power rails 346, 348 350, 352 and 354 has a width W2, where W2 is a length relative to the short axis of the structure, i.e., relative to the Y-axis. In some embodiments, width W2 is equal to between approximately (0.2*P2) to (0.7*P2).

As shown in FIG. 3B, relative to the Y-axis, a top half of back power rail 346 is outside of cell 302A while a bottom half of back power rail 346 is within cell 302A. A line of demarcation between the top half of back power rail 346 and the bottom half of back power rail 346 is boundary line 310 of cell 302A. The top half of each of back power rails 348, 350, and 352 is within cell 302A, while the bottom half of each of back power rails 348, 350, and 352 is within cell 302B. A line of demarcation between the top half of each of back power rail 348, back power rail 350, and back power rail 352, and the bottom half of each of back power rail 348, back power rail 350, and back power rail 352, is boundary line 312 of cells 302A, 302B. The top half of back power rail 354 is within cell 302B while the bottom half of hack power rail 354 is outside cell 302B. A line of demarcation between the top half of back power rail 354 and the bottom half of back power rail 354 is boundary line 318 of cell 302B.

Each of back power rail 346 and back power rail 354 is configured to receive reference voltage VVDD. Each of back power rail 348 and back power rail 352 is configured to receive reference voltage VSS. Back power rail 350 is configured to receive reference voltage TVDD. Back power rails 346, 348, 350, 352, 354 are thus used to distribute the different reference voltages TVDD, VVDD, and VSS to the semiconductor components (not shown) on semiconductor substrate 308. Back power rails 346, 348, 350, 352, 354 are isolated on back side 306 from front side conductive lines 326-332 and 336-342 on front side 304. Furthermore, the arrangement allows for single-mode cell (e.g., cell 302A) to be adjacent to single-mode cells (e.g., cell 302B) while distributing reference voltages TVDD, VVDD, and VSS.

Figure 3C:
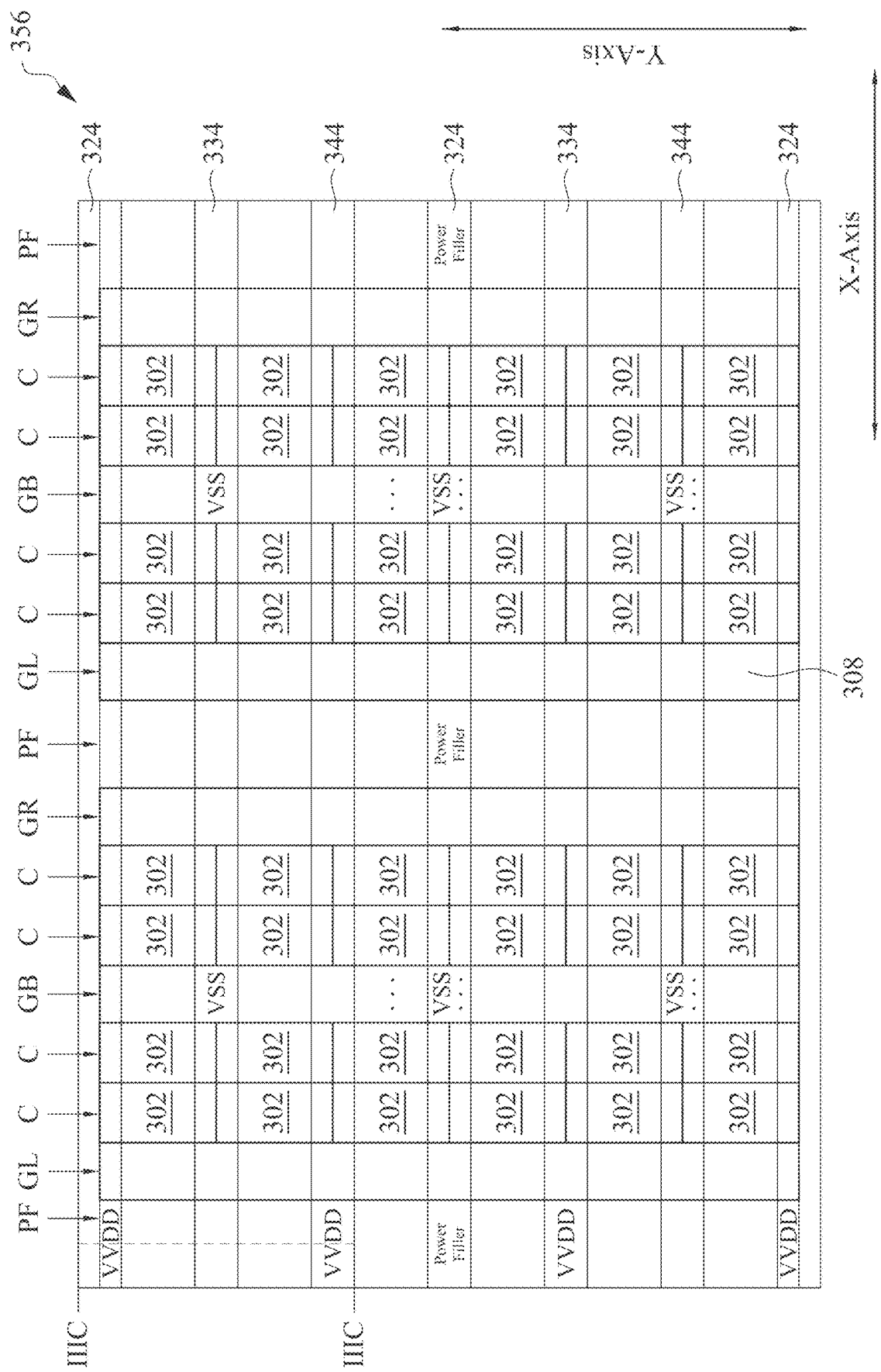
FIG. 3C is a layout diagram that is a representation of a semiconductor device, in accordance with some embodiments.

FIG. 3C is a layout diagram 356 that is a representation of a semiconductor device, in accordance with some embodiments.

Layout diagram 356 is a diagram of a technique for providing reference voltages VVDD and VSS from back side 306 (see FIG. 3D) to front side 304 so that reference voltages VVDD and VSS are supplied to power rails 324, 334 and 344.

As shown in FIG. 3C, a semiconductor device includes a plurality of rows and columns C of cells 302. In some embodiments, examples of cells 302 include cells 302A, 302B, another one of the cells described herein, and/or the like.

In FIG. 3C, relative to the X-axis, pairs of columns C abut one another. A gap GB extends in the first direction and is between two pairs of columns C. Relative to the X-axis, a gap GL is on a left side of the two pairs of columns C, and a gap GR is on the right side of the two pairs of columns C. To the left of gaps GL and/or to the right of gaps GR, layout diagram 356 includes power filler regions PF. Power filler regions PF facilitate power rails 324, 334 and 344 being able to pick up reference voltages VVDD and VSS from back side 306 of the semiconductor device. In FIG. 3C, power rails 324, 334 and 344 extend in the direction of the X-axis along boundaries of abutting cells 302 across gaps GL, GB, GR and also across power filler regions PF.

Figure 3D:
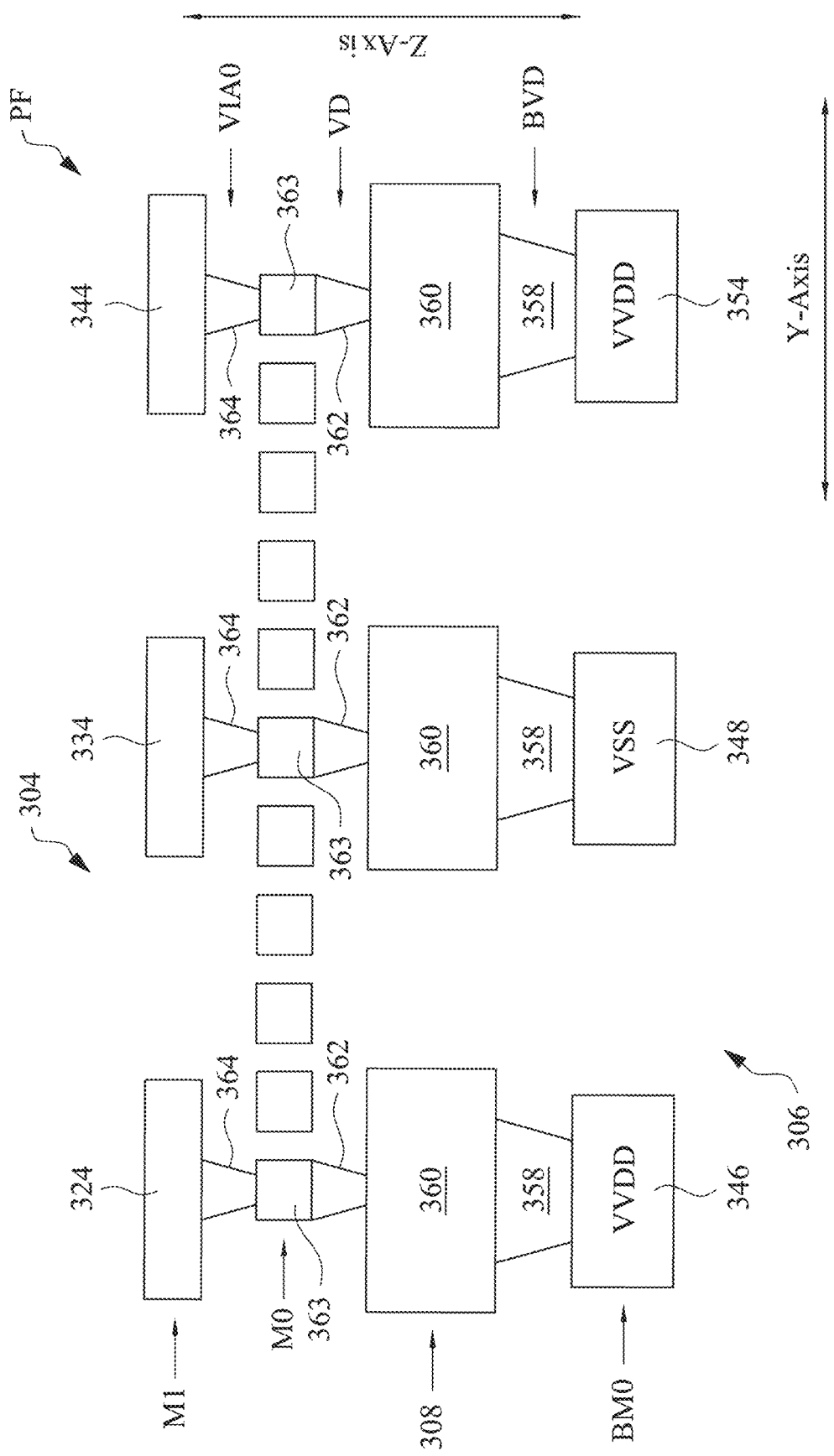
FIG. 3D is a cross section along line of FIG. 3C, in accordance with some embodiments.

FIG. 3D is a cross section along line IIIC of FIG. 3C, in accordance with some embodiments.

FIG. 3D includes semiconductor substrate 308. On back side 306, power filler region PF includes contact-to-transistor-component layer BVD and back metal layer BM0. In this embodiment, back side power rails 346, 348, 354 extend beneath cells 302 (see FIG. 3C), gaps GL, GB, GR (see FIG. 3C), and power filler regions PF. As mentioned above, back side power rail 346 is configured to receive reference voltage VVDD, back side power rail 348 is configured to receive reference voltage VSS, and back side power rail 354 is configured to receive reference voltage VVDD. In this embodiment, back side power rails 346, 348, 354 are located in back metal layer BM0. Back vias 358 in back via layer BVD connect back side power rail 346, 348, 354 to different semiconductor sections 360 of semiconductor substrate 308.

From front side to back side, relative to the Z-axis, front side metal layer M1, front side via layer VIA0, front side metal layer M0, front side via layer VGD, front side MD layer are in power filler regions PF in front side 304. The Z-axis is orthogonal to both the X-axis (see FIG. 1A) and the Y-axis. Front side metal vias 362 in front side via layer VD connect semiconductor sections 360 to conductors 363 in front side metal layer M0. Front side metal vias 364 in front side via layer VIA0 connect conductors 363 to conductors 324, 334, 344 in front side metal layer M1. In other embodiments, conductors 324, 334, 344 are located in front side metal layer other than front side metal layer M1, such as front side metal layer M0. Conductors 324, 334, 344 are biased by reference voltages, VVDD, VSS, as explained above. Semiconductor sections 306 are configured to electrically connect corresponding VD structures 362 and back vias 358. In some embodiments, semiconductor sections 306 are doped to conduct current.

FIG. 4A and FIG. 4B are corresponding layout diagrams 400 of cell 402A and cell 402B, in accordance with some embodiments.

FIG. 4A is a diagram of a front side 404 of layout diagram 400 and FIG. 4B is a diagram of a hack side 406 of layout diagram 400.

Layout diagram 400 has similarities to layout diagram 300 in FIG. 3A, 3B. Similar components in layout diagram 400 have the same element numbers as layout diagram 300 in FIG. 3A, 3B. The discussion will thus concentrate on differences between layout diagram 300 and layout diagram 400.

With regard to front side 404, a front side conduction line 407 is at boundary 312 between cell 402A and cell 402B. A lop half of front side conduction line 407 is within cell 402A and a bottom half of front side conduction line 407 is within cell 402B. Front side conduction line 407 has a long axis that extends in the direction of the X-axis and a short axis that extends in the direction of the Y-axis. In this embodiment, front side power rail 407 is configured to receive a control signal NSLEEPin'.

In FIG. 4A, cell 402A is between front side power rail 324 and front side conduction line 407. Cell 402A includes front side power rails 408, 410, 412, and 414 in layout diagram 400. Each of front side power rails 408, 410, 412, and 414 has a long axis that extends in the direction of the X-axis and has a short axis that extends in the direction of the Y-axis. Front side power rail 408 is configured to receive reference voltage TVDD, front side power rail 410 is configured to receive reference voltage VVDD, front side power rail 412 is configured to receive reference voltage TVDD, and front side power rail 414 is configured to receive reference voltage VVDD. Each of front side power rails 408, 410, 412, and 414 is configured to distribute reference voltages TVDD, VVDD to the circuits (not shown) in semiconductor substrate 308 in cell 402A.

Cell 402B is between front side conduction line 407 and front side power rail 344. Cell 402B includes front side power rails 416, 418, 420, and 422 in layout diagram 400. Each of front side power rails 416, 418, 420, and 422 has a long axis that extends in the direction of the X-axis and has a short axis that extends in the direction of the Y-axis. Front side power rail 416 is configured to receive reference voltage VVDD, front side power rail 418 is configured to receive reference voltage TVDD, front side power rail 420 is configured to receive reference voltage VVDD, and front side power rail 422 is configured to receive reference voltage TVDD. Each of front side power rails 416, 418, 420, and 422 is configured to distribute reference voltages TVDD, VVDD to the circuits (not shown) in semiconductor substrate 308 in cell 402B.

In this embodiment, back side 406 of layout diagram 400 shown in FIG. 4B is the same as back side 306 of layout diagram 300 shown in FIG. 3B. In some embodiments, cell 402A and cell 402B combine to provide a header cell that includes header circuit 202.

Figure 5B:
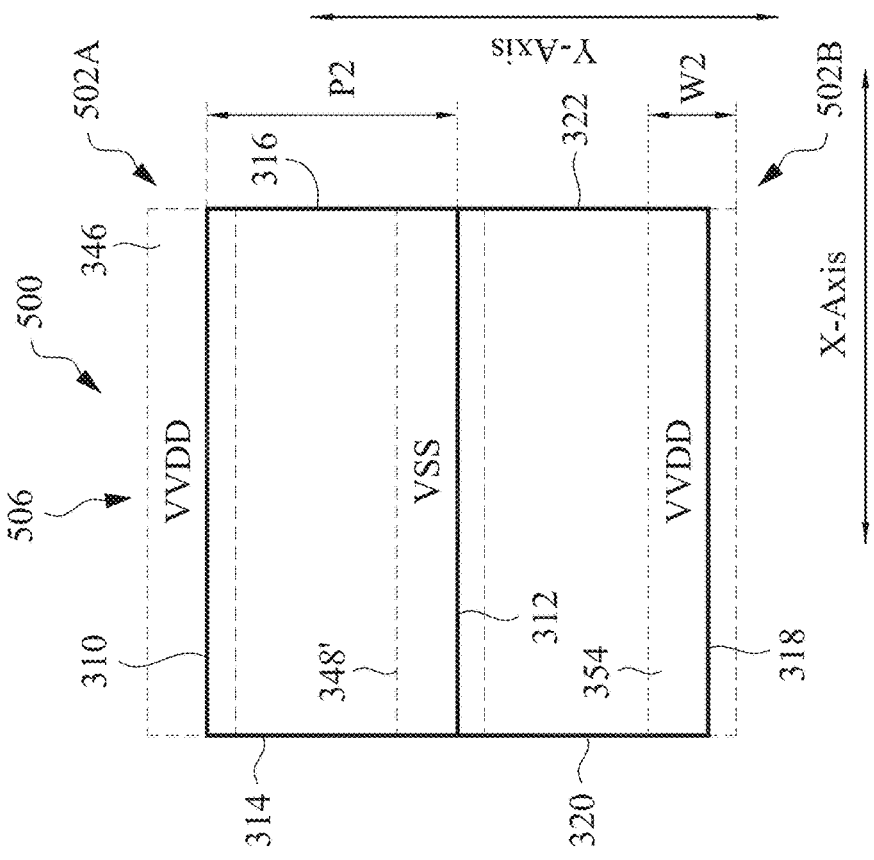
FIG. 5A and FIG. 5B are corresponding layout diagrams that illustrate abutting cells, in accordance with some embodiments.
Figure 5A:
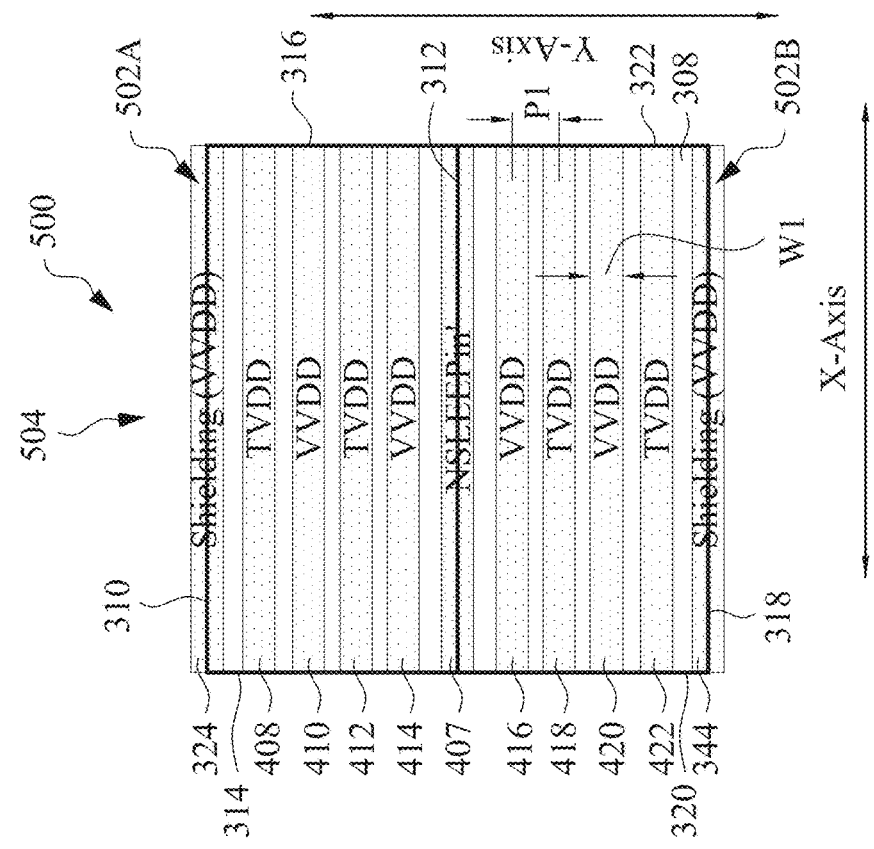

FIG. 5A and FIG. 5B are corresponding layout diagrams 500 that illustrates cell 502A and cell 502B, in accordance with some embodiments.

FIG. 5A is a diagram of a front side 504 of layout diagram 500 and FIG. 5B is a diagram of a back side 506 of layout diagram 500.

Layout diagram 500 has similarities to layout diagram 400 in FIG. 4A, 4B. Similar components in layout diagram 500 have the same element numbers as layout diagram 400 in FIG. 4A, 4B. The discussion will thus concentrate on differences between layout diagram 500 and layout diagram 400.

Front side 504 in FIG. 5A is the same as front side 404 in FIG. 4A. Back side 506 also includes back side power rail 346 and back side power rail 354, which are located and configured as explained above with respect to FIG. 3B and which correspondingly receive reference voltage VVDD. However, in this embodiment, back side 506 of FIG. includes back side power rail 348' but omits back side power rails 350 and 352 of FIG. 3B. Back side power rail 348' is configured to receive reference voltage VSS. Back side power rail 348' has a long axis that extends in the direction of the X-axis and a short axis that extends in the direction of the Y-axis. In FIG. 5B, hack side power rail 348' has a width of W2, like back side power rail 346 and back side power rail 354.

Back side power rail 348' is separated from back side power rail 346 by a pitch P2. Additionally, back side power rail 348' is separated from back side power rail 352 by pitch P2. In this embodiment, pitch P2 is approximately equal to the cell height of one of cells 502A, 502B.

As shown in FIG. 5B, the top half of back power rail 348' is within cell 502A while the bottom half of back power rail 348' is within cell 302B. A line of demarcation between top half of back power rail 348' and bottom half of back power rail 348 is boundary line 312 of cells 502A, 502B. In some embodiments, cell 502A and cell 502B combine to form a header cell that includes header circuit 202.

FIG. 6A and FIG. 6B are corresponding layout diagrams 600 of cell 602A, in accordance to some embodiments.

FIG. 6A is a diagram of a front side 604 of layout diagram 600 and FIG. 6B is a diagram of a back side 606 of layout diagram 600.

With respect to front side 604, cell 602A has similarities to cell 302A and front side 304 of FIG. 3A. Similar components in cell 602A on front side 604 have the same element numbers as cell 302A and front side 304 in FIG. 3A. The discussion of front side 604 will thus concentrate on differences between front side 604 in cell 602A and front side 304 of cell 302A in FIG. 3A.

In FIG. 6A, front side conduction line 326 is configured to receive an input signal IN and front side conduction line 332 is configured to provide an output signal Out. Furthermore, instead of having front side conduction line 328 (see FIG. 3A), cell 602A includes a front side power rail 628 between front side conduction line 326 and front side conduction line 332 relative to the Y-axis. Front side power rail 328 is configured to receive reference voltage TVDD. In some embodiments, reference voltage TVDD is distributed to semiconductor components (not shown) in semiconductor substrate 308 with front side power rail 328.

Back side 606 of cell 602A is the same as back side 506 of cell 502A. Back side 606 of cell 602 thus also includes back side power rail 346 configured to receive VVDD and back side power rail 348' configured to receive VSS.

FIG. 7A and FIG. 7B are corresponding layout diagrams 700 of cell 702A, in accordance with some embodiments.

FIG. 7A is a diagram of a front side 704 of layout diagram 700 and FIG. 7B is a diagram of a back side 706 of layout diagram 700.

Front side 704 of cell 702A is the same as front side 604 of cell 602A in FIG. 6A. Back side 706 of cell 702A is the same as back side 606 of cell 602A shown in FIG. 6B, except that in FIG. 7B, back side power rail 346 is configured to receive reference voltage TVDD instead of reference voltage VVDD.

Figures 8A, 8B:
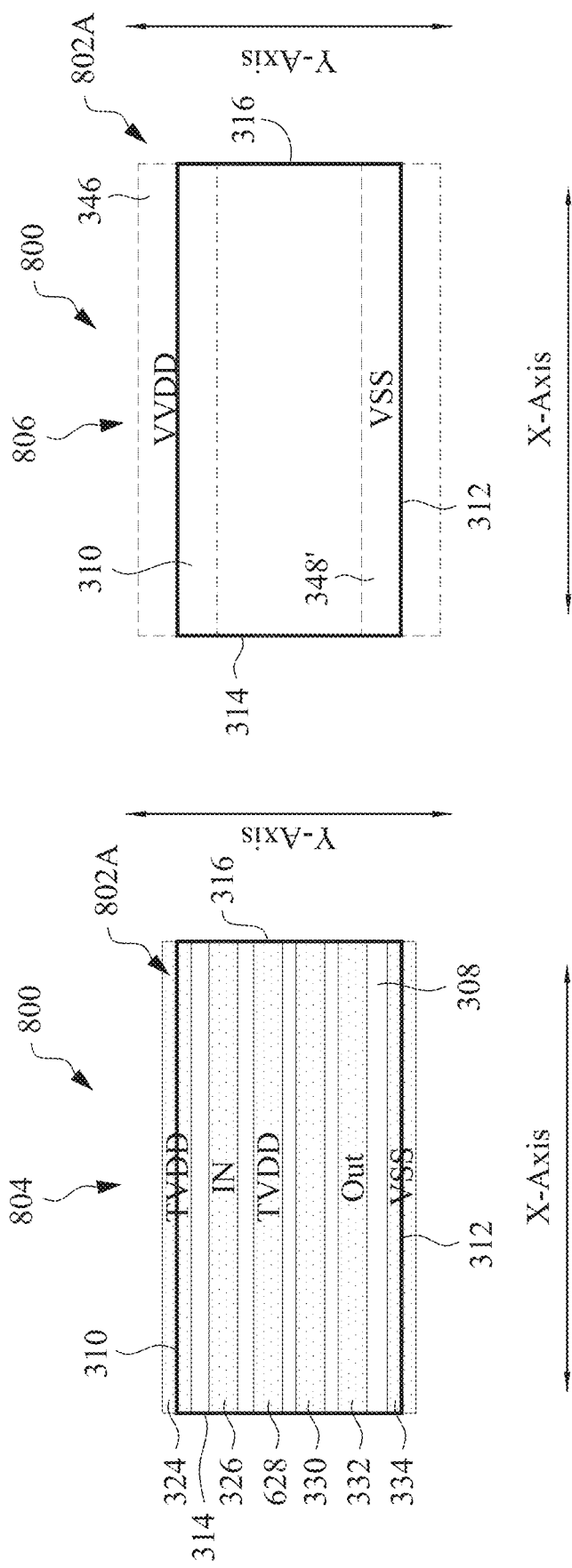
FIG. 8A and FIG. 8B are corresponding layout diagrams that illustrate a cell, in accordance with some embodiments.

FIG. 8A and FIG. 8B are corresponding layout diagrams 800 of cell 802A, in accordance with some embodiments.

FIG. 8A is a diagram of a front side 804 of layout diagram 800 and FIG. 8B is a diagram of a back side 806 of layout diagram 800.

Front side 804 of cell 802A is the same as front side 604 of cell 602A in FIG. 6A except that front side conduction line 324 is configured to receive reference voltage TVDD in FIG. 8A instead of reference voltage VVDD. Back side 806 of cell 802A is the same as back side 606 of cell 602A in FIG. 6B.

Figure 9:
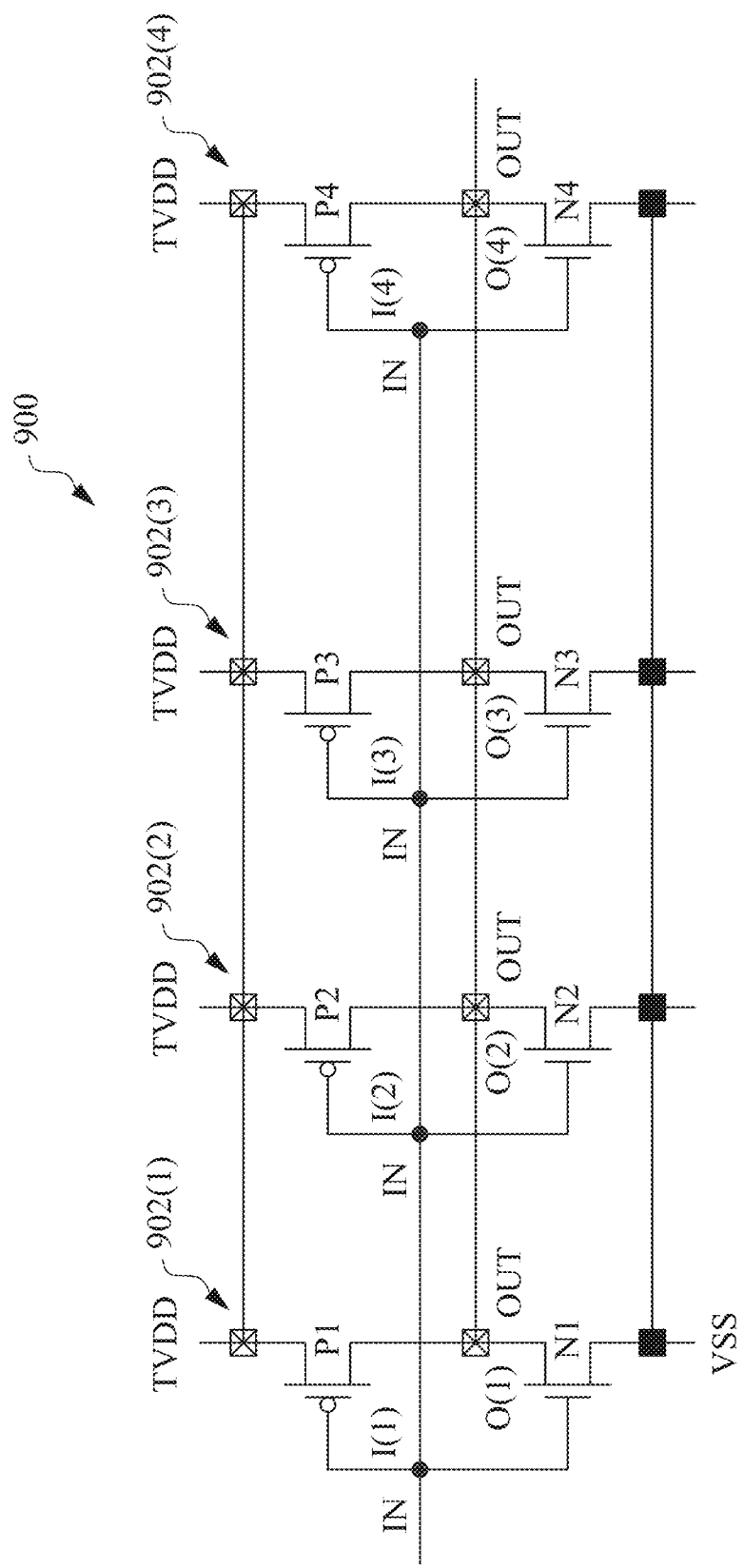
FIG. 9 is a circuit diagram, in accordance with some embodiments.

FIG. 9 is a circuit diagram, in accordance with some embodiments.

More specifically, circuit 900 includes four inverter/stages including stages 902(1)-902(4). Stage 902(1) includes a PMOS device P1 and an NMOS device N1. A gate of PMOS device P1 and a gate of NMOS device N1 are configured to receive input signal IN at an input node I(1). A drain of PMOS device P1 and a drain of NMOS device N1 are connected to an output node O(1). PMOS device P1 and NMOS device N1 are configured to generate output signal OUT at output node O(1). A source of PMOS device P1 is configured to receive reference voltage TVDD and the source of NMOS device N1 is configured to receive reference voltage VSS.

Stage 902(2) includes a PMOS device P2 and an NMOS device N2. A gate of PMOS device P2 and a gate of NMOS device N2 are configured to receive input signal IN at an input node I(2). A drain of PMOS device P2 and a drain of NMOS device N2 are connected to an output node O(2). PMOS device P2 and NMOS device N2 are configured to generate output signal OUT at output node O(2). A source of PMOS device P2 is configured to receive reference voltage TVDD and source of NMOS device N2 is configured to receive reference voltage VSS.

Stage 902(3) includes a PMOS device P3 and an NMOS device N3. A gate of PMOS device P3 and a gate of NMOS device N3 are configured to receive input signal IN at an input node I(3). A drain of PMOS device P3 and a drain of NMOS device N3 are connected to an output node O(3). PMOS device P3 and NMOS device N3 are configured to generate output signal OUT at output node O(3). A source of PMOS device P3 is configured to receive reference voltage TVDD and the source of NMOS device N3 is configured to receive reference voltage VSS.

Stage 902(4) includes a PMOS device P4 and an NMOS device N4. A gate of PMOS device P4 and a gate of NMOS device N4 are configured to receive input signal IN at an input node I(4). A drain of PMOS device P4 and a drain of NMOS device N4 are connected to an output node O(4). PMOS device P4 and NMOS device N4 are configured to generate output signal OUT at output node O(4). A source of PMOS device P4 is configured to receive reference voltage TVDD and the source of NMOS device N4 is configured to receive reference voltage VSS.

In FIG. 9, the sources of PMOS devices P1-P4 are connected to one another. Additionally, the sources of NMOS device N1-N4 are connected to one another. Input nodes I(1)-I(4) are connected to one another. Output nodes O(1)-O(4) are connected to one another. In this manner, stages 902(1)-902(4) operate together to generate output signal Out in response to input signal IN.

Figure 10B:
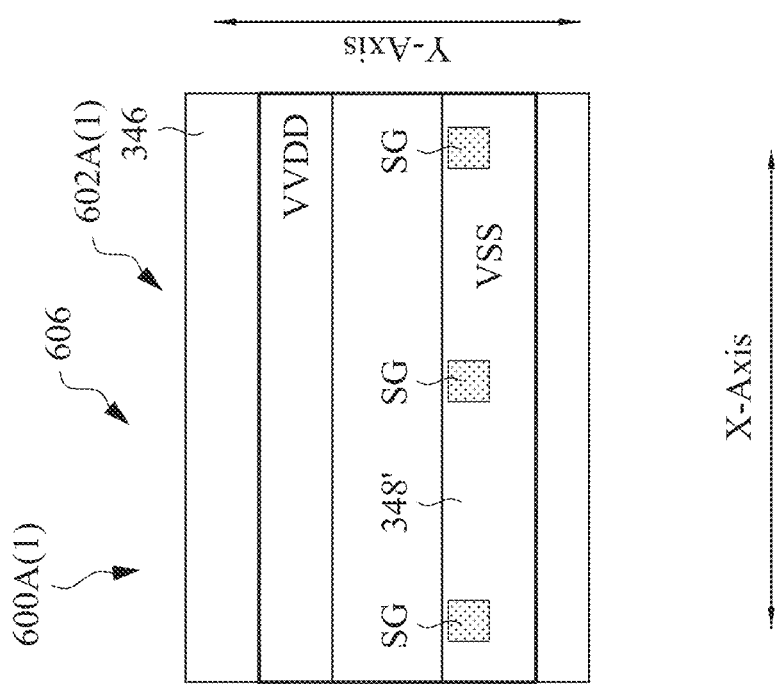
FIG. 10A and FIG. 10B are corresponding layout diagrams of a cell, in accordance with some embodiments.
Figure 10A:
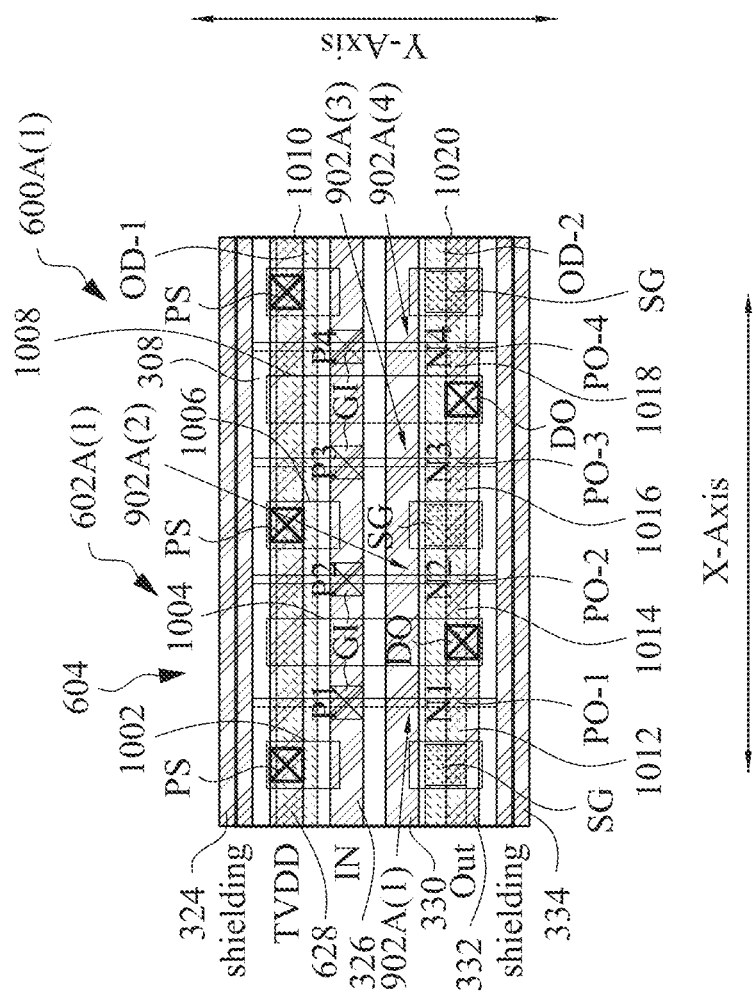

FIG. 10A and FIG. 10B are corresponding layout diagrams 600A(1) of a cell 602A(1), in accordance with some embodiments.

Layout diagram 600A(1) has similarities to layout diagram 600 in FIGS. 6A, 6B. Similar components in layout diagram 600A(1) have the same element numbers as layout diagram 600 in FIGS. 6A, 6B. The discussion will thus concentrate on differences between layout diagram 600A(1) and layout diagram 600. In some embodiments, the layout diagrams of FIGS. 10A-10B are a representation of circuit 900 of FIG. 9.

FIG. 10A is a diagram of front side 604 of cell 602A(1) and FIG. 10B is a diagram of back side 606 of cell 602A(1). Cell 602A(1) is one version of cell 602A shown in FIG. 6A, 6B. Cell 602A(1) also represents one example of four stage circuit 900 shown in FIG. 9.

As shown in FIG. 10A, semiconductor substrate 308 includes active regions OD-1, OD-2. Active regions are schematically illustrated in the drawings with the label OD (see FIG. 1B). Active regions OD-1, OD-2 are elongated along the first direction, i.e., parallel to the X-axis. In some embodiments, active region OD-1 includes P-type conductivity and active region OD-2 includes N-type conductivity.

A plurality of gates PO-1, PO-2, PO-3, PO-4, are over active regions OD-1, OD-2. Gates PO-1, PO-2, PO-3, PO-4 are elongated in the second direction, i.e., parallel with the Y-axis, which is transverse to the X-axis. Gates PO-1, PO-2, PO-3, PO-4, are arranged spaced apart from one another in the direction of the X-axis at a regular pitch. Two gates are considered directly adjacent where there are no other gates between the two gates. In some embodiments, the regular pitch represents one contacted poly pitch (CPP) for the corresponding semiconductor process technology node. In some embodiments, gates PO-1, PO-2, PO-3, PO-4, include a conductive material, such as polysilicon, which is sometimes referred to as "poly." Gates PO-1, PO-2, PO-3, PO-4, are schematically illustrated in the drawings with the label "PO." Other conductive materials for the gates, such as metals, are within the scope of various embodiments. In some embodiments, gates PO-1, PO-2, PO-3, PO-4 are in a PO layer, which is between semiconductor substrate 308 and via layer VGD (See FIG. 2) relative to the Z-axis (See FIG. 2).

Drain/source regions 1002, 1004, 1006, 1008, 1010 are formed on both sides of gates PO-1, PO-2, PO-3, PO-4 in active region OD-1. Drain/source regions 1012, 1014, 1016, 1018, 1020 are formed on corresponding sides of gates PO-1, PO-2, PO-3, PO-4 in active region OD-2. PMOS device P1 includes gate PO-1, a drain in the form of drain/source region 1002 and a source in the form of drain/source region 1004. PMOS device P2 includes gate PO-2, a drain in the form of drain/source region 1006 and a source in the form of drain/source region 1004. PMOS device P3 includes gate PO-3, a drain in the form of drain/source region 1006 and a source in the form of drain/source region 1008. PMOS device P4 includes gate PO-4, a drain in the form of drain/source region 1010 and a source in the form of drain/source region 1008.

NMOS device N1 includes gate PO-1, a drain in the form of drain/source region 1012 and a source in the form of drain/source region 1014. NMOS device N2 includes gate PO-2, a drain in the form of drain/source region 1016 and a source in the form of drain/source region 1014. NMOS device N3 includes gate PO-3, a drain in the form of drain/source region 1016 and a source in the form of drain/source region 1018. NMOS device N4 includes gate PO-4, a drain in the form of drain/source region 1020 and a source in the form of drain/source region 1018.

PMOS device P1 and NMOS device N1 are in stage 902(1) of circuit 900. PMOS device P2 and NMOS device N2 are in stage 902(2) of circuit 900. PMOS device P3 and NMOS device N3 are in stage 902(3) of circuit 900. PMOS device P4 and NMOS device N4 are in stage 902(4) of circuit 900.

In FIG. 10A, front side power rail 628 is configured to receive reference voltage TVDD. Vias PS in via layer VGD are configured to connect drain/source regions 1002, 1006, 1010 to front side power rail 628 so that the sources of each of PMOS devices P1-P4 receive reference voltage TVDD. More specifically in this embodiment, a drain/source contact is in MD metal layer and on each of drain/source regions 1002, 1006, 1010. Each of vias PS connects front side power rail 628 to the drain/source contact connected to each of drain/source regions 1002, 1006, 1010.

In FIG. 10A, front side conduction line 326 is configured to receive input signal IN. Vias GI in via layer VGD are configured to connect gates PO-1, PO-2, PO-3, PO-4 to front side conduction line 326 so that the gates of each of PMOS devices P1-P4 and NMOS devices N1-N4 receive input signal IN.

A drain/source contact in the MD layer connects drain/source region 1004 to drain/source region 1014. Additionally, a drain/source contact in the MD layer connects drain/source region 1008 to drain/source region 1018. In FIG. 10A, front side conduction line 332 is configured to receive output signal Out. Vias DO in via layer VGD are configured to connect one of the drain/source contacts on drains/source regions 1014, 1018 to front side conduction line 332 so that the drains of each of PMOS devices P1-P4 and NMOS devices N1-N4 outputs output signal Out.

Finally, as shown in FIG. 10B, back side power rail 348' is configured to receive reference voltage VSS (e.g., a ground voltage). Back vias SG are located in back via layer BVD and each connects to a corresponding one of drain/source regions 1012, 1016, 1020 (see FIG. 10A). Back vias SG also connect to back side power rail 348'. In this manner, the source of each of NMOS devices N1-N4 is configured to receive reference voltage VSS.

Because the sources of each of PMOS devices P1-P4 are configured to receive reference voltage TVDD, layout diagram 602A(1) is an example of a single-mode cell (i.e., an ungated-power-driven cell).

Figure 11B:
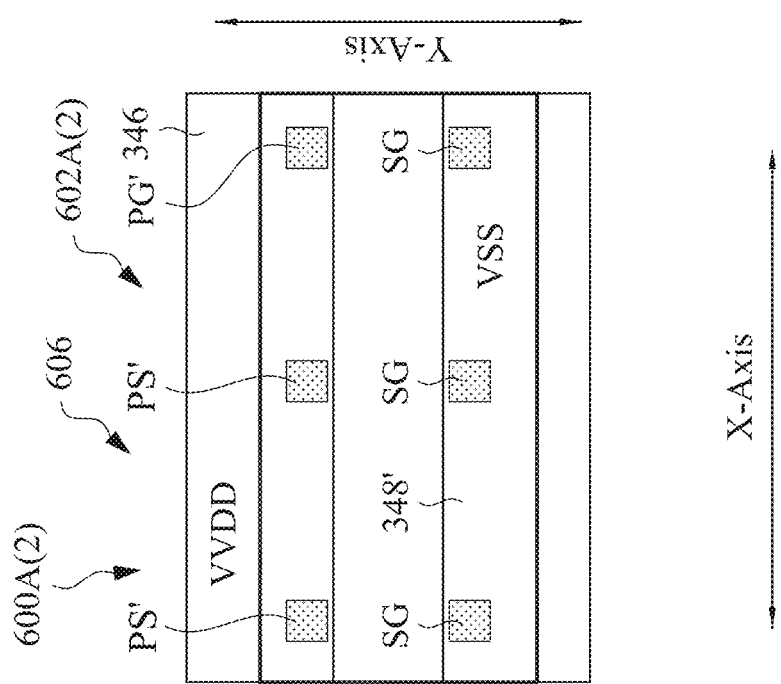
FIG. 11A and FIG. 11B are corresponding layout diagrams of a cell, in accordance with some embodiments.
Figure 11A:
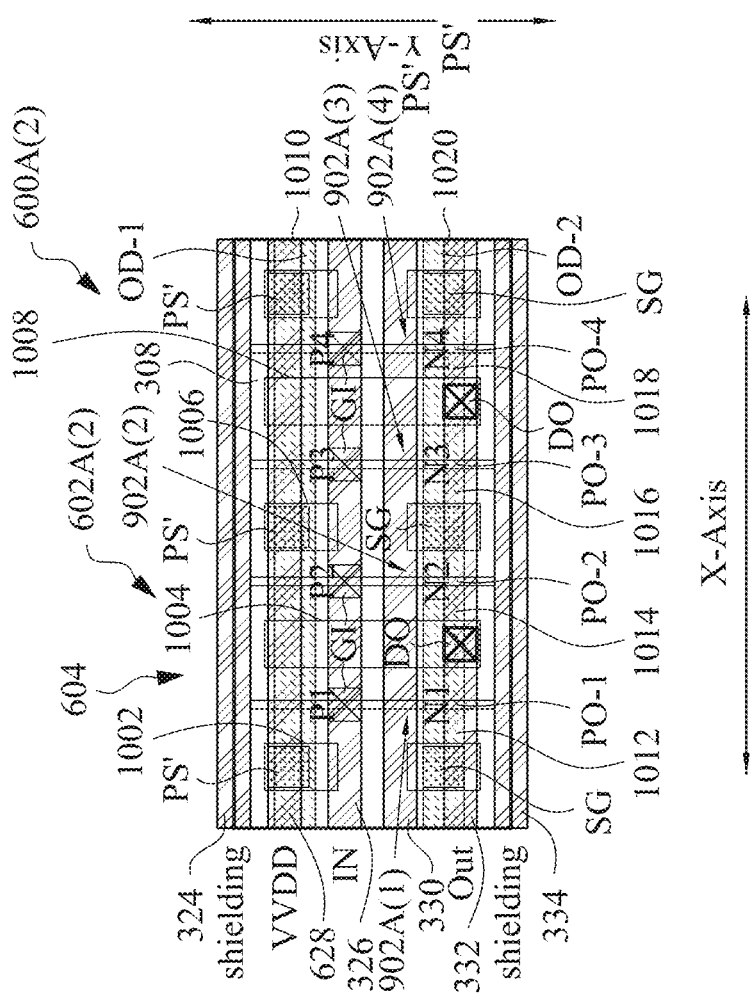

FIG. 11A and FIG. 11B are corresponding layout diagrams 600A(2) of cell 602A(2), in accordance with some embodiments.

FIG. 11A is a diagram of front side 604 of cell 602A(2) and FIG. 11B is a diagram of back side 606 of cell 602A(2). Cell 602A(2) is similar to cell 602A(1) shown in FIG. 10A, 10B. Similar components have the same element numbers in FIG. 11A, 11B as in FIG. 10A, 10B. For the sake of brevity, this discussion concentrates on the difference between cell 602A(2) and cell 602A(1).

In FIG. 11A and FIG. 11B, cell 602A(2) includes back vias PS' instead of vias PS (see FIG. 10A). Also, front side conduction line 628 is configured to receive reference voltage VVDD instead of reference voltage TVDD. However, in FIG. 11A, each of back vias PS' is in back via layer BVD and is configured to connect a corresponding one of drain/source regions 1002, 1006, 1010 to back side reference rail 346. In this manner, the source of each of PMOS devices P1-P4 is configured to receive reference voltage VVDD. As such, cell 602A(2) is an example of a dual-mode cell (i.e., a gated-power-driven cell).

Figure 12:
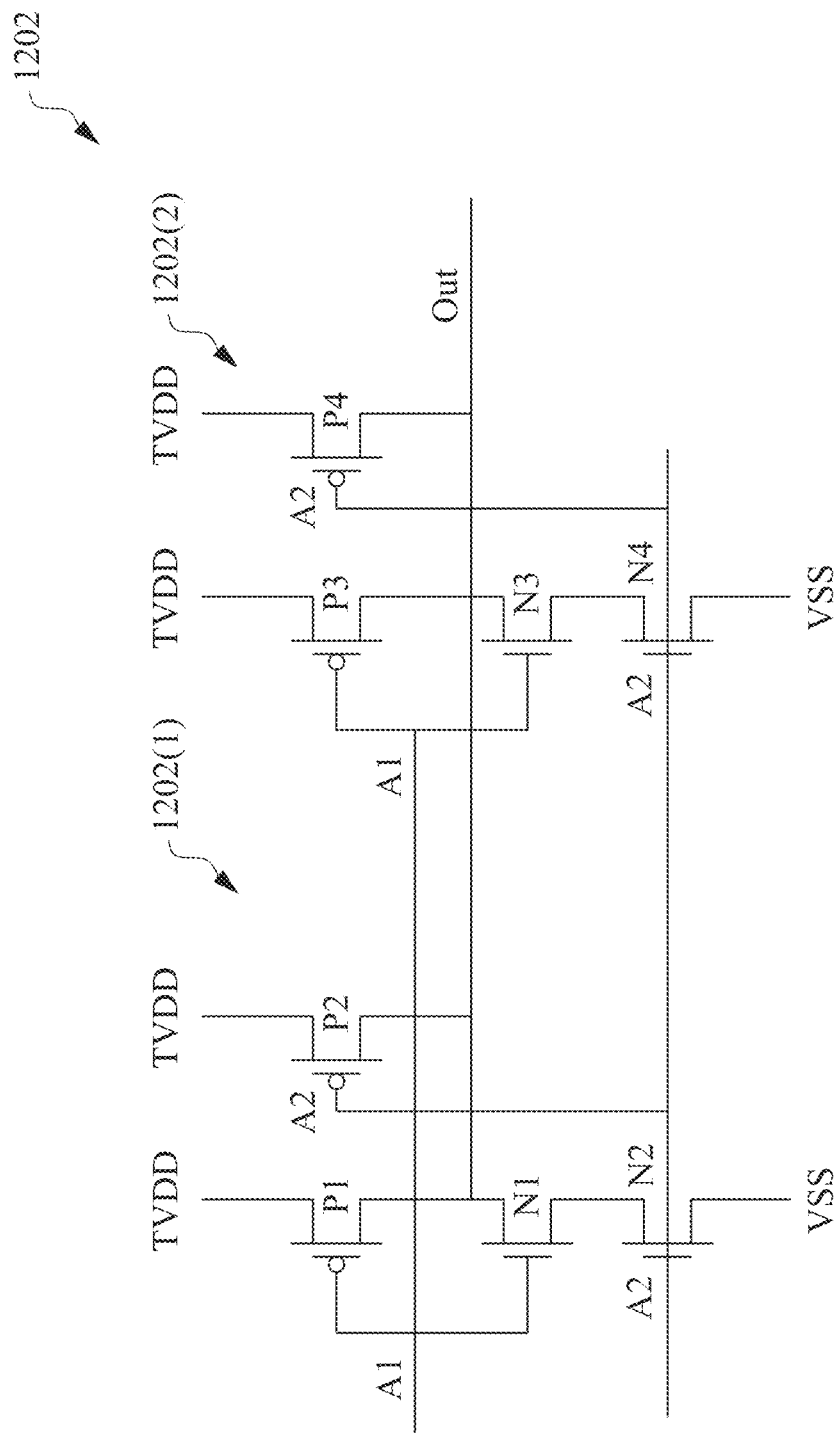
FIG. 12 is a circuit diagram of a NAND gate in accordance with some embodiments.

FIG. 12 is a circuit diagram of an NAND gate 1200, in accordance with some embodiments.

In FIG. 12, NAND gate 1200 is a two stage NAND gate. A stage 1202(1) of NAND gate 1200 includes a PMOS device P1, a PMOS device P2, an NMOS device N1, and an NMOS device N2. Each of a gate of PMOS device P1 and a gate of NMOS device N1 is configured to receive input signal A1. A drain of PMOS device P1 and a drain of NMOS device N1 are connected to one another. A gate of PMOS device P2 and a gate of NMOS device N2 are configured to receive input signal A2. A source of PMOS device P1 and a source of PMOS device P2 are configured to receive reference voltage TVDD. A source of NMOS device N2 is configured to receive reference voltage VSS. A source of NMOS device N1 is connected to a drain of NMOS device N2. An output signal Out is generated at the drain of PMOS device Pb, the drain of PMOS device P2, and the drain of NMOS device N1.

In FIG. 12, NAND gate 1200 is a two stage NAND gate. A stage 1202(2) of NAND gate 1200 includes a PMOS device P3, a PMOS device P4, an NMOS device N3, and an NMOS device N4. Each of a gate of PMOS device P3 and a gate of NMOS device N3 is configured to receive input signal A1. A drain of PMOS device P3 and a drain of NMOS device N3 are connected to one another. A gate of PMOS device P4 and a gate of NMOS device N4 are configured to receive input signal A2. A source of PMOS device P3 and a source of PMOS device P4 are configured to receive reference voltage TVDD. A source of NMOS device N4 is configured to receive reference voltage VSS. A source of NMOS device N3 is connected to a drain of NMOS device N4. Output signal Out is generated at the drain of PMOS device P3, the drain of PMOS device P4, and the drain of NMOS device N3.

As shown in FIG. 12, the gates of PMOS device P1, NMOS device N1, PMOS device P3, and NMOS device N3 are all connected to one another. Furthermore, the source of PMOS device P1, the source of PMOS device P2, the drain of NMOS device N1, the source of PMOS device P3, the source of PMOS device P4, and the drain of NMOS device N3 are all connected to one another to generate output signal Out. The gate of NMOS device N2 is connected to the gate of NMOS device N4.

Figure 13B:
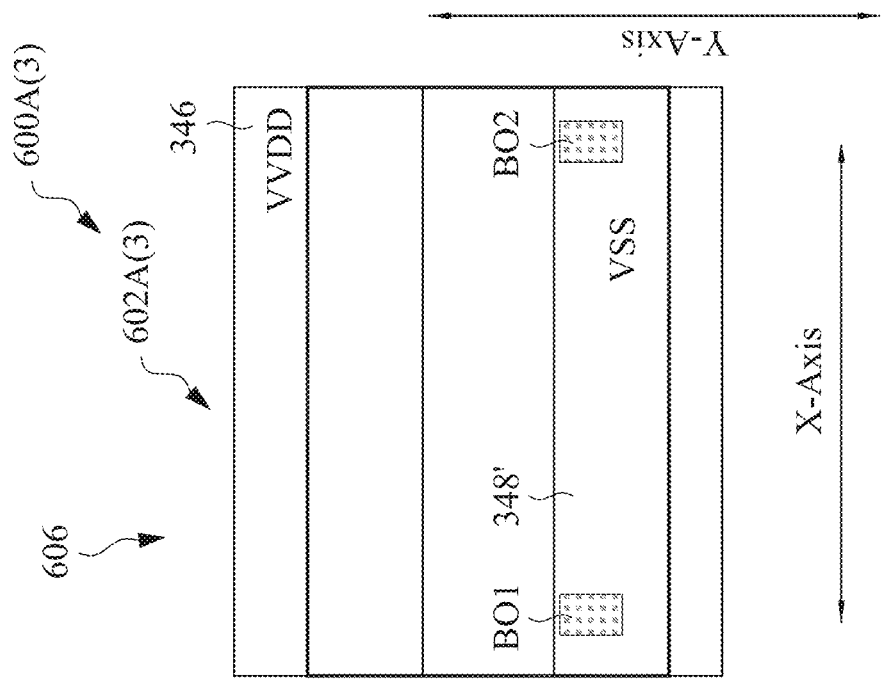
FIG. 13A and FIG. 13B are corresponding layout diagrams of a cell, in accordance with some embodiments.
Figure 13A:
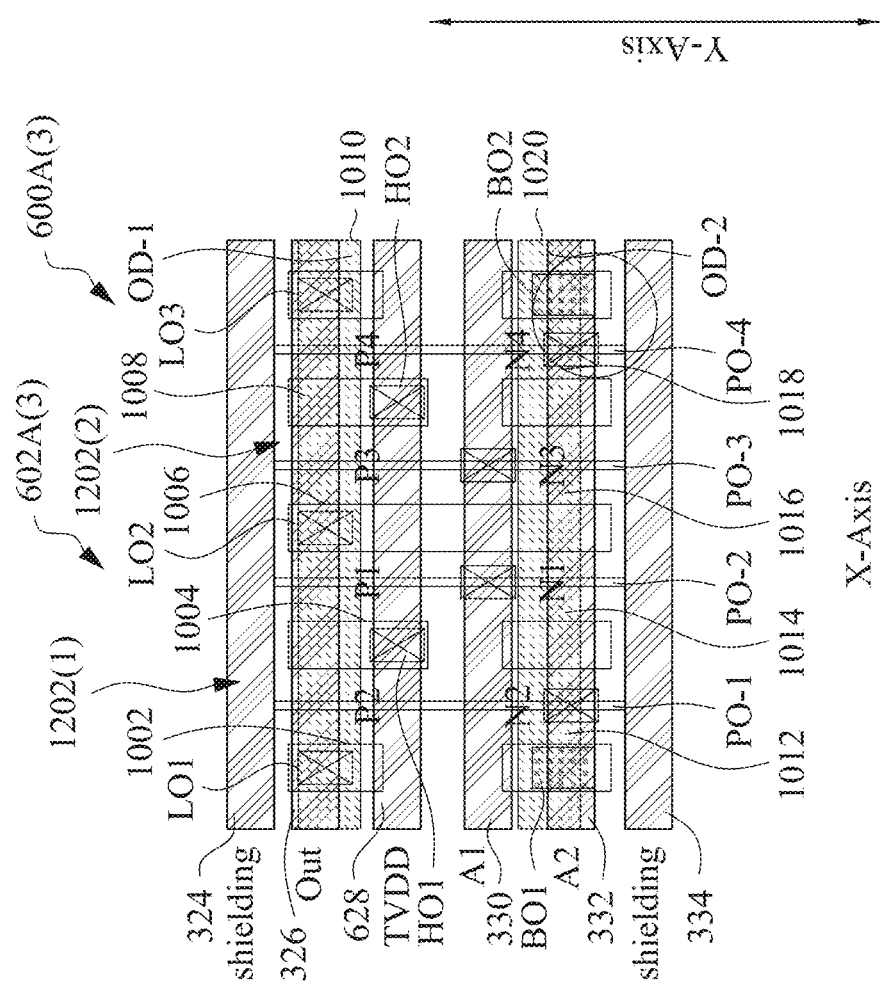

FIG. 13A and FIG. 13B are corresponding layout diagrams 600A(3) of cells 602A(3), in accordance with some embodiments.

Layout diagram 600A(3) has similarities to layout diagram 600 in FIGS. 6A, 6B. Similar components in layout diagram 600A(3) have the same element numbers as layout diagram 600 in FIGS. 6A, 6B. The discussion will thus concentrate on differences between layout diagram 600A(3) and layout diagram 600. In some embodiments, the layout diagrams of FIGS. 13A-13B are a representation of NAND gate 1200 of FIG. 12.

FIG. 13A is a diagram of front side 604 of cell 602A(3) and FIG. 13B is a diagram of back side 606 of cell 602A(3). Cell 602A(3) is one version of cell 602A shown in FIG. 6A, 6B. Common components between cell 602A(1) in FIG.

11A and FIG. 11B and cell 602A(3) in FIG. 13A and FIG. 13B have the same element numbers and a discussion is not repeated herein.

In FIG. 13A, front side conduction line 326 is configured to receive output signal Out. Front side power rail 628 is configured to receive reference voltage TVDD. Front side conduction line 330 is configured to receive input signal A1. Front side conduction line 332 is configured to receive input signal A2.

In FIG. 13A, the source of PMOS device P1 is in drain/source region 1004 and the drain of PMOS device P1 is in drain/source region 1006. Gate PO-2 is the gate of PMOS device P1. The source of PMOS device P2 is in drain/source region 1004 and the drain of PMOS device P2 is in drain/source region 1002. Gate PO-1 is the gate of PMOS device P2. The source of PMOS device P3 is in drain/source region 1008 and the drain of PMOS device P3 is in drain/source region 1006. Gate PO-3 is the gate of PMOS device P3. The source of PMOS device P4 is in drain/source region 1008 and the drain of PMOS device P4 is in drain/source region 1010. Gate P004 is the gate of PMOS device P4.

In FIG. 13A, the source of NMOS device N1 is in drain/source region 1016 and the drain of NMOS device N1 is in drain/source region 1014. Gate PO-2 is the gate of NMOS device N1. The source of NMOS device N2 is in drain/source region 1012 and the drain of NMOS device N2 is in drain/source region 1014. Gate PO-1 is the gate of NMOS device N2. The source of NMOS device N3 is in drain/source region 1018 and the drain of NMOS device N3 is in drain/source region 1016. Gate PO-3 is the gate of NMOS device N3. The source of NMOS device N4 is in drain/source region 1020 and the drain of NMOS device N4 is in drain/source region 1018. Gate PO-4 is the gate of NMOS device N4.

A drain/source contact in metal layer MD is on drain/source region 1002. The drain/source contact is connected to a via LO1 in via layer VGD and via LO1 is connected to front side conduction line 326. A drain/source contact in metal layer MD is on drain/source region 1006 and on drain/source region 1016. This drain/source contact connects drain/source region 1006 and drain/source region 1016. The drain/source contact is connected to a via LO2 in via layer VGD and via LO2 is connected to front side conduction line 326. A drain/source contact in metal layer MD is on drain/source region 1010. The drain/source contact is connected to a via LO3 in via layer VGD and via LO3 is connected to front side conduction line 326.

A drain/source contact in metal layer MD is on drain/source region 1004. The drain/source contact is connected to a via HO1 in via layer VGD and via HO1 is connected to front side power rail 628. A drain/source contact in metal layer MD is on drain/source region 1008. The drain/source contact is connected to a via HO2 in via layer VGD and via HO2 is connected to front side power rail 628.

In FIG. 13A and FIG. 13B, a via BO1 in back via layer BVD connects drain/source region 1012 to back side power rail 348'. Also, a via BO2 in back via layer BVD connects drain/source region 1020 to back side power rail 348'.

Because the sources of PMOS devices P1, P2, P3, P4 are powered by reference voltage TVDD, cell 602A(3) is an example of a single-mode cell (i.e., an ungated-power-driven cell).

Figure 14B:
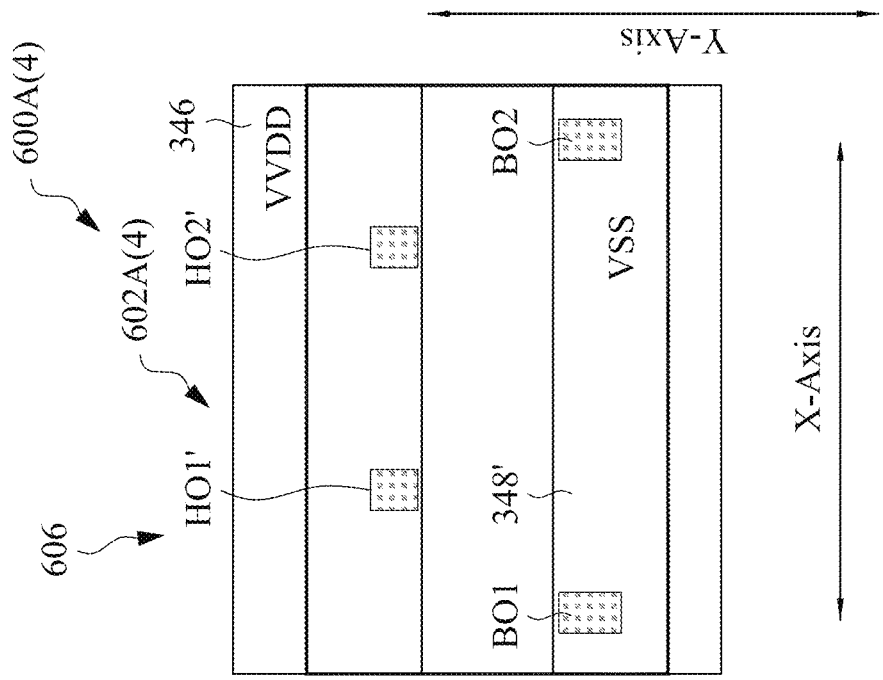
FIG. 14A and FIG. 14B are corresponding layout diagrams of a cell, in accordance with some embodiments.
Figure 14A:
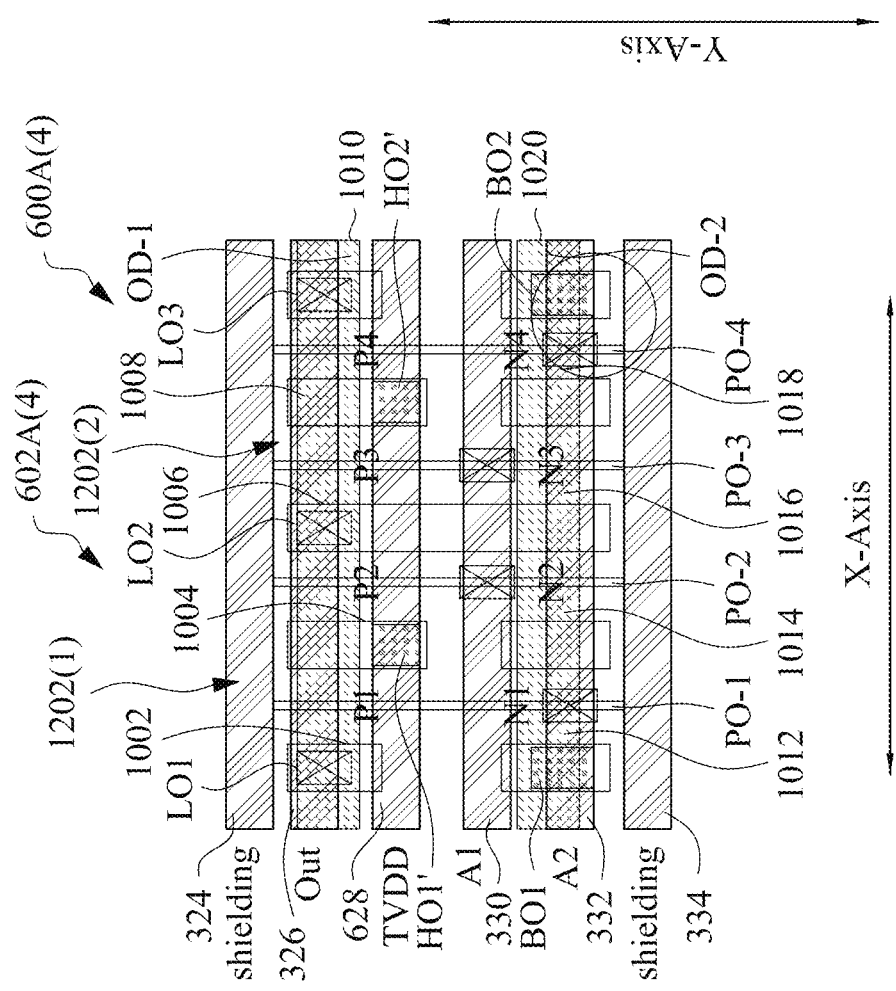

FIG. 14A and FIG. 14B are corresponding layout diagrams 600A(4) of a cell 602A(4), in accordance with some embodiments.

FIG. 14A is a diagram of front side 604 of cell 602A(4) and FIG. 14B is a diagram of back side 606 of cell 602A(4). Cell 602A(4) is similar to cell 602A(3) shown in FIG. 13A, 13B. Similar components have the same element numbers in FIG. 14A, 14B as in FIG. 13A, 13B. For the sake of brevity, this discussion concentrates on the difference between cell 602A(3) and cell 602A(4).

In FIG. 14A and FIG. 14B, cell 602A(4) includes back vias HO1', HO2' instead of vias HO1, HO2 (See FIG. 13A). Also, front side conduction line 628 is configured to receive reference voltage VVDD instead of reference voltage TVDD. However, in this embodiment, back vias HO1' is in back via layer BVD and is configured to connect drain/source region 1004 to back side reference rail 346. Also, back vias HO2' is in back via layer BVD and is configured to connect drain/source region 1008 to back side reference rail 346. In this manner, the sources of each of PMOS devices P1-P4 are configured to receive reference voltage VVDD. As such, cell 602(A)(4) is an example of a dual-mode cell (i.e., a gated-power-driven cell).

Figure 15:
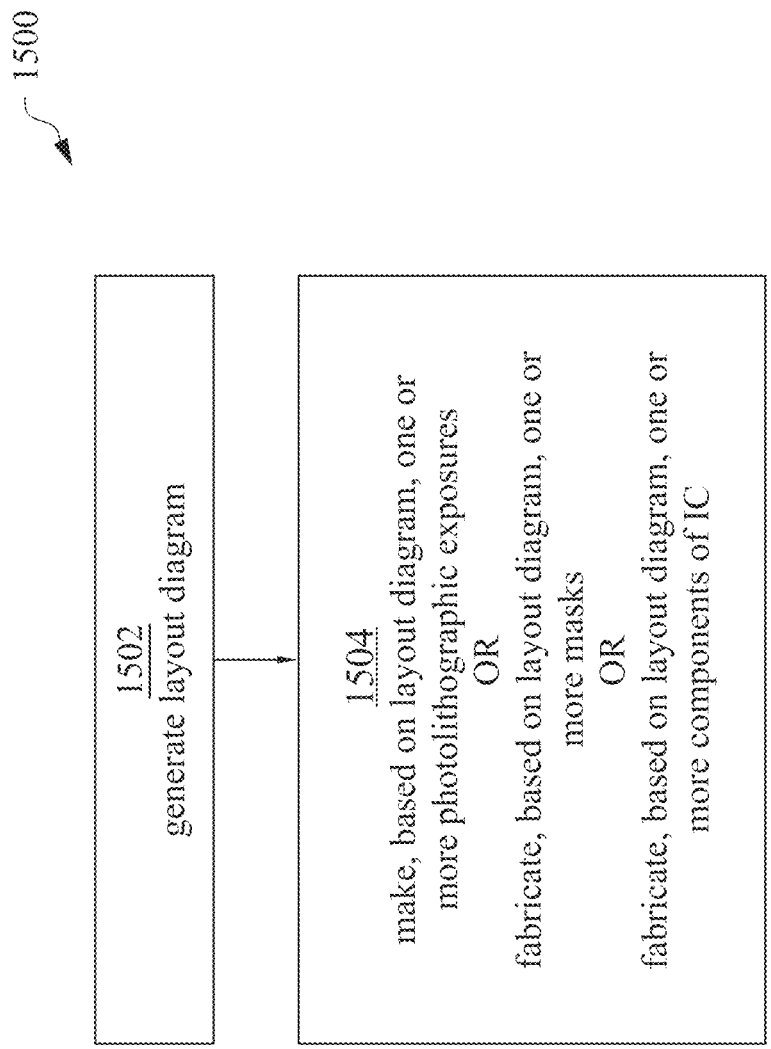
FIG. 15 is a flowchart of a method of manufacturing a semiconductor device, in accordance with some embodiments.

FIG. 15 is a flowchart of a method 1500 of manufacturing a semiconductor device, in accordance with some embodiments.

Method 1500 is implementable, for example, using EDA system 1900 (FIG. 19, discussed below) and an integrated circuit (IC), manufacturing system 2000 (FIG. 20, discussed below), in accordance with some embodiments. Examples of a semiconductor device which can be manufactured according to method 1500 include semiconductor device 100 of FIG. 1A, circuit 200 of FIG. 2, the semiconductor device represented by layout diagram 300 in FIG. 3A, 3B, the semiconductor device represented by layout diagram 356 in FIG. 3C, 3D, the semiconductor device represented by layout diagram 400 in FIG. 4A, 4B, the semiconductor device represented by layout diagram 500 in FIG. 5B, the semiconductor device represented by layout diagram 600 in FIG. 6A, 6B, the semiconductor device represented by layout diagram 700 in FIG. 7A, 7B, the semiconductor device represented by layout diagram 800 in FIG. 8A, 8B, circuit 900 in FIG. 9, the semiconductor device represented by cell 602A(1) in FIG. 10A, 10B, the semiconductor device represented by cell 602A(2) in FIG. 11A, 11B, circuit 1200 in FIG. 12, the semiconductor device represented by cell 602A(3) in FIG. 13A, 13B, and the semiconductor device represented by cell 602A(4) in FIG. 14A, 14B.

In FIG. 15, method 1500 includes blocks 1502-1504. At block 1502, a layout diagram is generated which, among other things, includes one or more of layout diagrams disclosed herein, or the like. Block 1502 is implementable, for example, using EDA system 1900 (FIG. 19, discussed below), in accordance with some embodiments. From block 1502, flow proceeds to block 1504.

At block 1504, based on the layout diagram, at least one of (A) one or more photolithographic exposures are made or (B) one or more semiconductor masks are fabricated or (C) one or more components in a layer of a semiconductor device are fabricated. See discussion below of FIG. 20.

Figure 16:
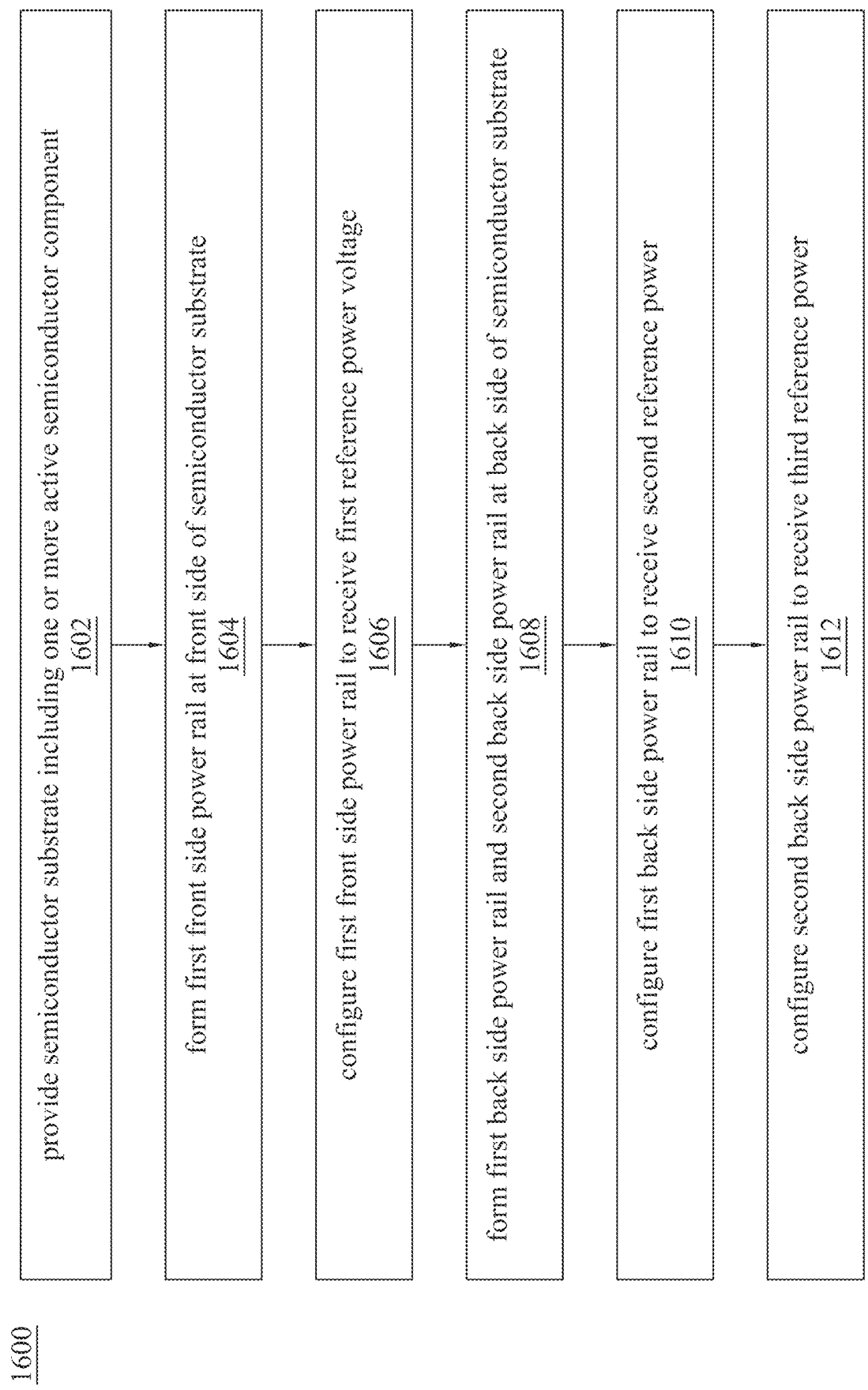
FIG. 16 is a flowchart of a method of fabricating a semiconductor device, in accordance with some embodiments.

FIG. 16 is a flowchart 1600 of a method of fabricating a semiconductor device, in accordance with some embodiments.

In FIG. 16, flowchart 1600 is one embodiment of performing block 1504 in FIG. 15. In FIG. 16, flowchart 1600 includes blocks 1602-1612.

At block 1602, a semiconductor substrate includes one or more active semiconductor components, wherein a front side is defined over the semiconductor substrate and a back side is defined beneath the semiconductor substrate.

Examples of the semiconductor substrate include semiconductor substrate 113 in FIG. 2, and semiconductor substrate 308 in each of FIGS. 3A, 3C, 3D, 5A, 6A, 7A, 8A, 10A, 11A, 13A and 14A, or the like. From block 1602, the flow proceeds to block 1604.

At block 1604, a first front side power rail is formed at the front side of the semiconductor substrate. Examples of the first front side power rail include front side power rail 324, 334, 344 in each of FIGS. 3A, 3C, 3D, 4A, 5A, 6A, 7A, 8A, 10A, 11A, 13A, 14A, front side power rail 408, 410, 412, 414, 416, 418, 420, 422 in each of FIGS. 4A, 5A, front side power rail 628 in each of FIGS. 6A, 7A, 8A, 10A, 11A, 13A, 14A, or the like. From block 1604, the flow proceeds to block 1606.

At block 1606, the first front side power rail is configured to receive a first reference power voltage. Examples of the first reference power voltage include reference voltage TVDD, reference voltage VVDD, and reference voltage VSS in corresponding FIGS. 2, 3A-3D, 4A-4B, 5A-5B, 6A-6B, 7A-7B. 8A-8B, 9, 10A-10B, 11A-11B, 12, 13A-13B and 14A-14B, or the like. From block 1606, the flow proceeds to block 1608.

At block 1608, a first hack side power rail and a second hack side power rail are formed at the back side of the semiconductor substrate. Examples of the first back side power rail and the second back side power rail include back side power rails 346, 348, 350, 352, 354 in FIGS. 3B, 3D, 4B, 5B, 6B, 7B, 8B, 10B, 11B, 13B and 14B, back side power rail 348' in FIGS. 5B, 6B, 7B, 8B, 10B, 11B, 13B and 14B, or the like. From block 1608, the flow proceeds to block 1610.

At block 1610, the first hack side power rail is configured to receive a second reference power voltage. Examples of the second reference power voltage include reference voltage TVDD, reference voltage VVDD, and reference voltage VSS in corresponding FIGS. 2, 3A-3D, 4A-4B, 5A-5B, 6A-6B, 7A-7B. 8A-8B, 9, 10A-10B, 11A-11B, 12, 13A-13B and 14A-14B, or the like. From block 1610, the flow proceeds to block 1612.

At block 1612, the second back side power rail is configured to receive a third reference power voltage, wherein the first reference power voltage, the second reference power voltage, and the third reference power voltage are different from each other. Examples of the third reference power voltage include reference voltage TVDD, reference voltage VVDD, and reference voltage VSS in corresponding FIGS. 2, 3A-3D, 4A-4B, 6A-6B, 7A-7B. 8A-8B, 9, 10A-10B, 11A-11B, 12, 13A-13B and 14A-14B or the like.

Figure 17:
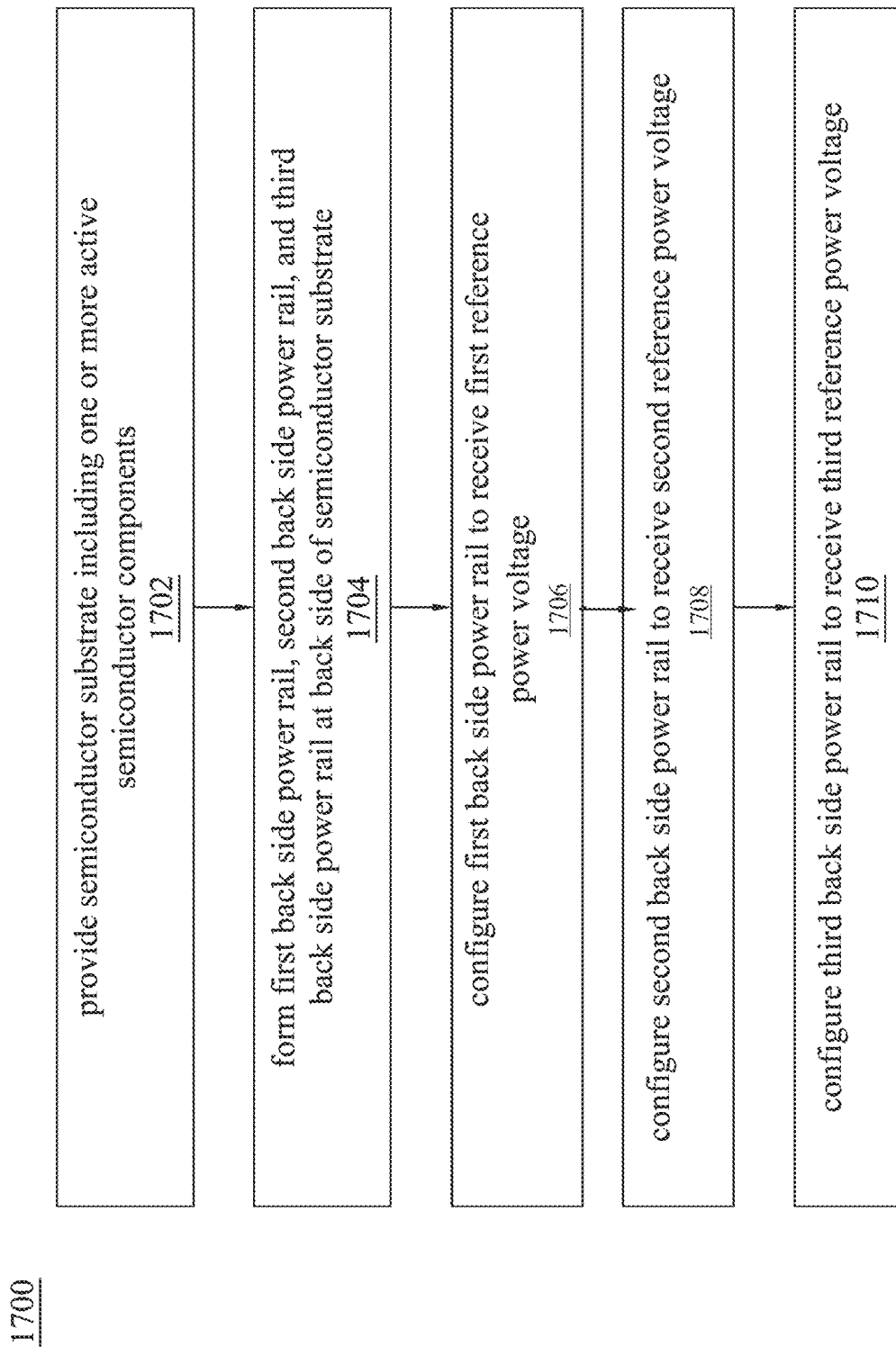
FIG. 17 is a flowchart of a method of fabricating a semiconductor device, in accordance with some embodiments.

FIG. 17 is a flowchart 1700 of a method of fabricating a semiconductor device, in accordance with some embodiments.

In FIG. 17, flowchart 1700 is one embodiment of performing block 1504 in FIG. 15. FIG. 17, flowchart 1700 includes blocks 1702-1710.

At block 1702, a semiconductor substrate includes one or more active semiconductor components, wherein a front side is defined over the semiconductor substrate and a back side is defined beneath the semiconductor substrate. Examples of the semiconductor substrate include semiconductor substrate 113 in FIG. 2, and semiconductor substrate 308 in FIGS. 3A, 3C, 3D, 5A, 6A, 7A, 8A, 10A, 11A, 13A and 14A, or the like. From block 1702, the flow proceeds to block 1704.

At block 1704, a first back side power rail, a second back side power rail, and a third back side power rail are formed at the back side of the semiconductor substrate. Examples of the first back side power rail, the second back side power rail, and the third hack side power rail include back side power rails 346, 348, 350, 352, 354 in FIGS. 3B, 3D, 4B, 5B, 6B, 7B, 8B, 10B, 11B, 13B and 14B, back side power rail 348' in FIGS. 5B, 6B, 7B, 8B, 10B, 11B, 13B and 14B, or the like. From block 1704, the flow proceeds to block 1706.

At block 1706, the first back side power rail is configured to receive a first reference power voltage. Examples of the first reference power voltage include reference voltage TVDD, reference voltage VVDD, and reference voltage VSS in corresponding FIGS. 2, 3A-3D, 4A-4B, 5A-5B, 6A-6B, 7A-7B. 8A-8B, 9, 10A-10B, 11A-11B, 12, 13A-13B and 14A-14B, or the like. From block 1706, the flow proceeds to block 1708.

At block 1708, the second back side power rail is configured to receive a second reference power voltage. Examples of the second reference power voltage include reference voltage TVDD, reference voltage VVDD, and reference voltage VSS in corresponding FIGS. 2, 3A-3D, 4A-4B, 5A-5B, 6A-6B, 7A-7B. 8A-8B, 9, 10A-10B, 11A-11B, 12, 13A-13B and 14A-14B, or the like. From block 1708, the flow proceeds to block 1710.

At block 1710, the third hack side power rail is configured to receive a third reference power voltage, wherein the first reference power voltage, the second reference power voltage, and the third reference power voltage are different from each other. Examples of the third reference power voltage include reference voltage TVDD, reference voltage VVDD, and reference voltage VSS in corresponding FIGS. 2, 3A-3D, 4A-4B, 6A-6B, 7A-7B. 8A-8B, 9, 10A-10B, 11A-11B, 12, 13A-13B and 14A-14B, or the like.

Figure 18:
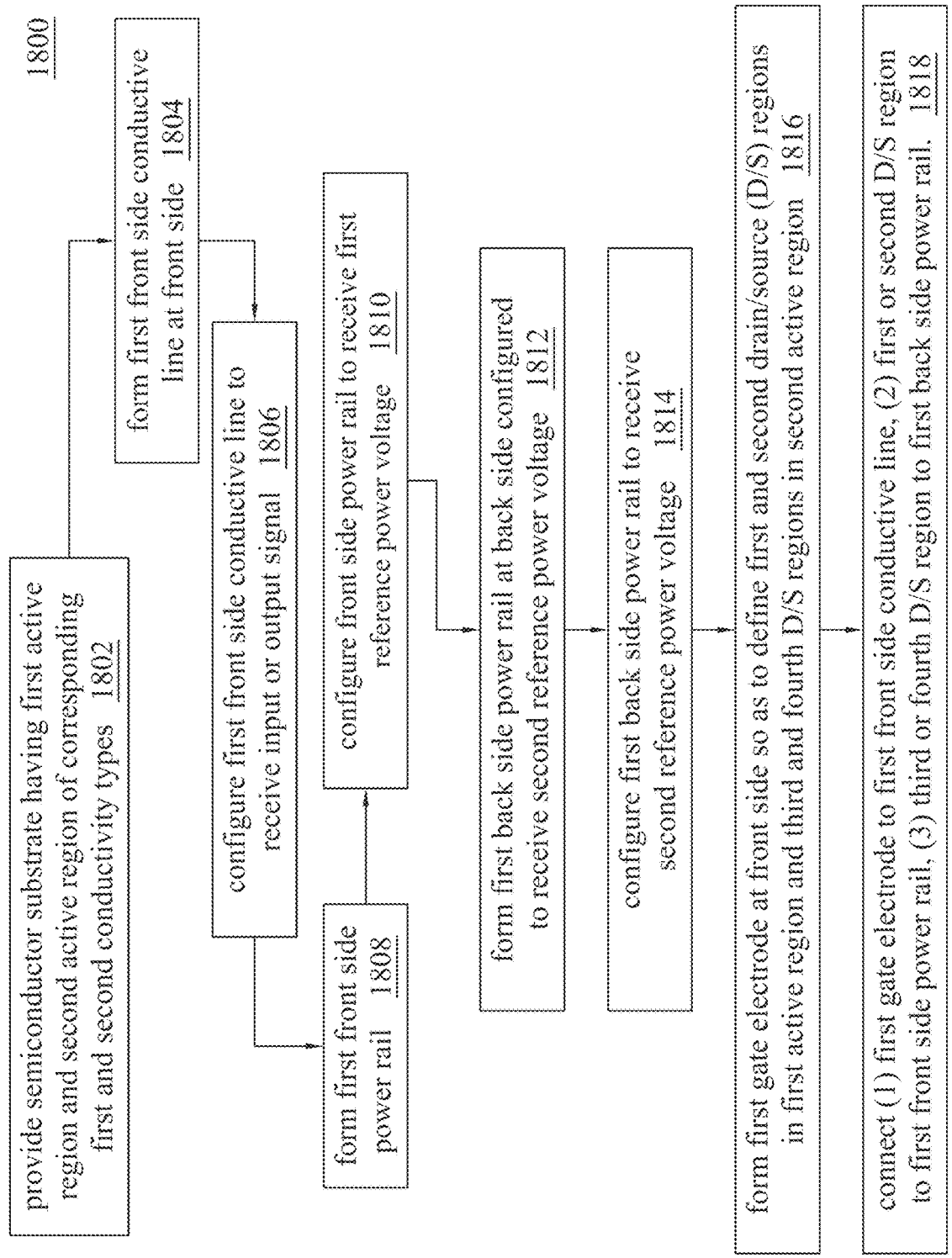
FIG. 18 is a flowchart of a method of fabricating a semiconductor device having a cell region, in accordance with some embodiments.

FIG. 18 is a flowchart 1800 of a method of fabricating a semiconductor device having a cell region, in accordance with some embodiments.

In FIG. 18, flowchart 1800 is one embodiment of performing block 1504 in FIG. 15. FIG. 18, flowchart 1800 includes blocks 1802-1818.

At block 1802, a semiconductor substrate has first and second active regions of corresponding first and second conductivity types that correspondingly extend in a first direction, and a front side is defined over the semiconductor substrate and a back side is defined beneath the semiconductor substrate. Examples of the semiconductor substrate include semiconductor substrate 308 in FIGS. 10A, 11A, 13A and 14A, or the like. Examples of the first active region and the second active region include active regions OD-1, OD-2 in FIGS. 10A, 11A, 13A and 14A, or the like. From block 1802, the flow proceeds to block 1804.

At block 1804, a first front side conductive line is formed at the front side. Examples of the first front side conductive line include front side conduction line 326 in FIGS. 10A and 11A, front side conduction lines 330, 332 in FIGS. 13A and 14A, or the like. From block 1804, the flow proceeds to block 1806.

At block 1806, the first front side conductive line is configured to receive an input or output signal. An example of the input or output signal is input signal IN in FIGS. 10A and 11A, input signals A1, A2 in FIGS. 13A and 13B, or the like. From block 1806, the flow proceeds to block 1808.

At block 1808, a first front side power rail is formed. An example of the first front side power rail includes front side power rail 628 in FIGS. 10A and 13A, or the like. From block 1808, the flow proceeds to block 1810.

At block 1810, the front side power rail is configured to receive a first reference power voltage. An example of the first reference power voltage is TVDD in FIGS. 10A and 13A, or the like. From block 1810, the flow proceeds to block 1812.

At block 1812, a first back side power rail is formed at the back side. Examples of the first back side power rail include back side power rail 348' in FIG. 10B, back side power rail 346, 348' in FIG. 11B, back side power rail 348' in FIG. 13B, back side power rail 346, 348' in FIG. 14B, or the like. From block 1812, the flow proceeds to block 1814.

At block 1814, the first back side power rail is configured to receive a second reference power voltage. An example of the second reference power voltage is VVDD in FIGS. 10B and 13B, or the like. From block 1814, the flow proceeds to block 1816.

At block 1816, a first gate electrode is formed at the front side, the first gate electrode extending in a second direction that is substantially orthogonal to the first direction so as to define a first drain/source region and a second drain/source region in the first active region and a third drain/source region and fourth drain/source region in the second active region. Examples of the first gate electrode includes gate electrodes PO-1, PO-2, PO-3, PO-4 in FIG. 11A, 12A, 13A, 14A. Examples of the first drain/source region and the second drain/source region include drain/source regions 1002, 1006, 1010 in FIG. 10A and drain/source regions 1004, 1008 in FIG. 13A. Examples of third drain/source region and fourth drain/source region include drain/source regions 1012, 1016, 1018 in FIG. 10A and 1012, 1014 in FIG. 13A. From block 1816, the flow proceeds to block 1818.

At block 1818, (1) the first gate electrode is connected to the first front side conductive line, (2) the first drain/source region or the second drain/source region is connected to the first front side power rail, and (3) the third drain/source region or the fourth drain/source region is connected to the first back side power rail. Examples of the connections made by block 1818 include the connections shown in FIGS. 10A-10B and 13A-13B, or the like.

Figure 19:
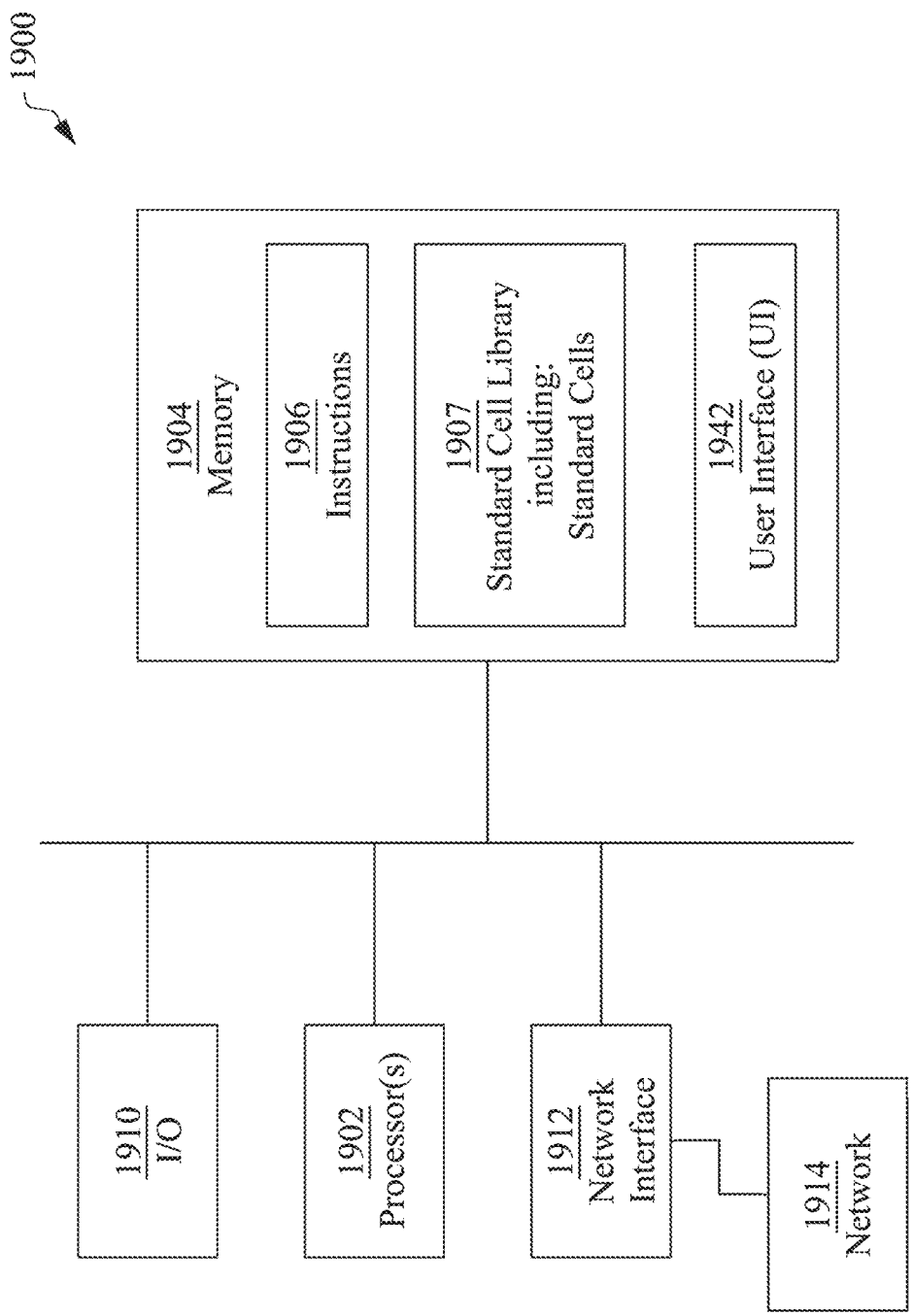
FIG. 19 is a block diagram of an electronic design automation (EDA) system, in accordance with some embodiments.

FIG. 19 is a block diagram of an electronic design automation (EDA) system 1900, in accordance with some embodiments.

In some embodiments, EDA system 1900 includes an APR system. Methods described herein of designing layout diagrams, in accordance with one or more embodiments, are implementable, for example, using EDA system 1900, in accordance with some embodiments.

In some embodiments, EDA system 1900 is a general purpose computing device including a hardware processor 1902 and a non-transitory, computer-readable storage medium 1904. Storage medium 1904, amongst other things, is encoded with, i.e., stores, computer program code 1906, i.e., a set of executable instructions. Execution of instructions 1906 by hardware processor 1902 represents (at least in part) an EDA tool which implements a portion or all of the methods described herein in accordance with one or more embodiments (hereinafter, the noted processes and/or methods).

Processor 1902 is electrically coupled to computer-readable storage medium 1904 via a bus 1908. Processor 1902 is also electrically coupled to an I/O interface 1910 by bus 1908. A network interface 1912 is also electrically connected to processor 1902 via bus 1908. Network interface 1912 is connected to a network 1914, so that processor 1902 and computer-readable storage medium 1904 are capable of connecting to external elements via network 1914. Processor 1902 is configured to execute computer program code 1906 encoded in computer-readable storage medium 1904 in order to cause system 1900 to be usable for performing a portion or all of the noted processes and/or methods. In one or more embodiments, processor 1902 is a central processing unit (CPU), a multi-processor, a distributed processing system, an application specific integrated circuit (ASIC), and/or a suitable processing unit.

In one or more embodiments, computer-readable storage medium 1904 is an electronic, magnetic, optical, electromagnetic, infrared, and/or a semiconductor system (or apparatus or device). For example, computer-readable storage medium 1904 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1904 includes a compact disk-read only memory (CD-ROM), a compact disk-read/write (CD-R/W), and/or a digital video disc (DVD).

In one or more embodiments, storage medium 1904 stores computer program code 1906 configured to cause system 1900 (where such execution represents (at least in part) the EDA tool) to be usable for performing a portion or all of the noted processes and/or methods. In one or more embodiments, storage medium 1904 also stores information which facilitates performing a portion or all of the noted processes and/or methods. In one or more embodiments, storage medium 1904 stores library 1907 of standard cells including such standard cells as disclosed herein. In one or more embodiments, storage medium 1904 stores one or more layout diagrams 1909 corresponding to one or more layouts disclosed herein.

EDA system 1900 includes I/O interface 1910. I/O interface 1910 is coupled to external circuitry. In one or more embodiments, I/O interface 1910 includes a keyboard, keypad, mouse, trackball, trackpad, touchscreen, and/or cursor direction keys for communicating information and commands to processor 1902.

EDA system 1900 also includes network interface 1912 coupled to processor 1902. Network interface 1912 allows system 1900 to communicate with network 1914, to which one or more other computer systems are connected. Network interface 1912 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1900.

System 1900 is configured to receive information through I/O interface 1910. The information received through I/O interface 1910 includes one or more of instructions, data, design rules, libraries of standard cells, and/or other parameters for processing by processor 1902. The information is transferred to processor 1902 via bus 1908. EDA system 1900 is configured to receive information related to a UI through I/O interface 1910. The information is stored in computer-readable medium 1904 as user interface (UI) 1942.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1900. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 20:
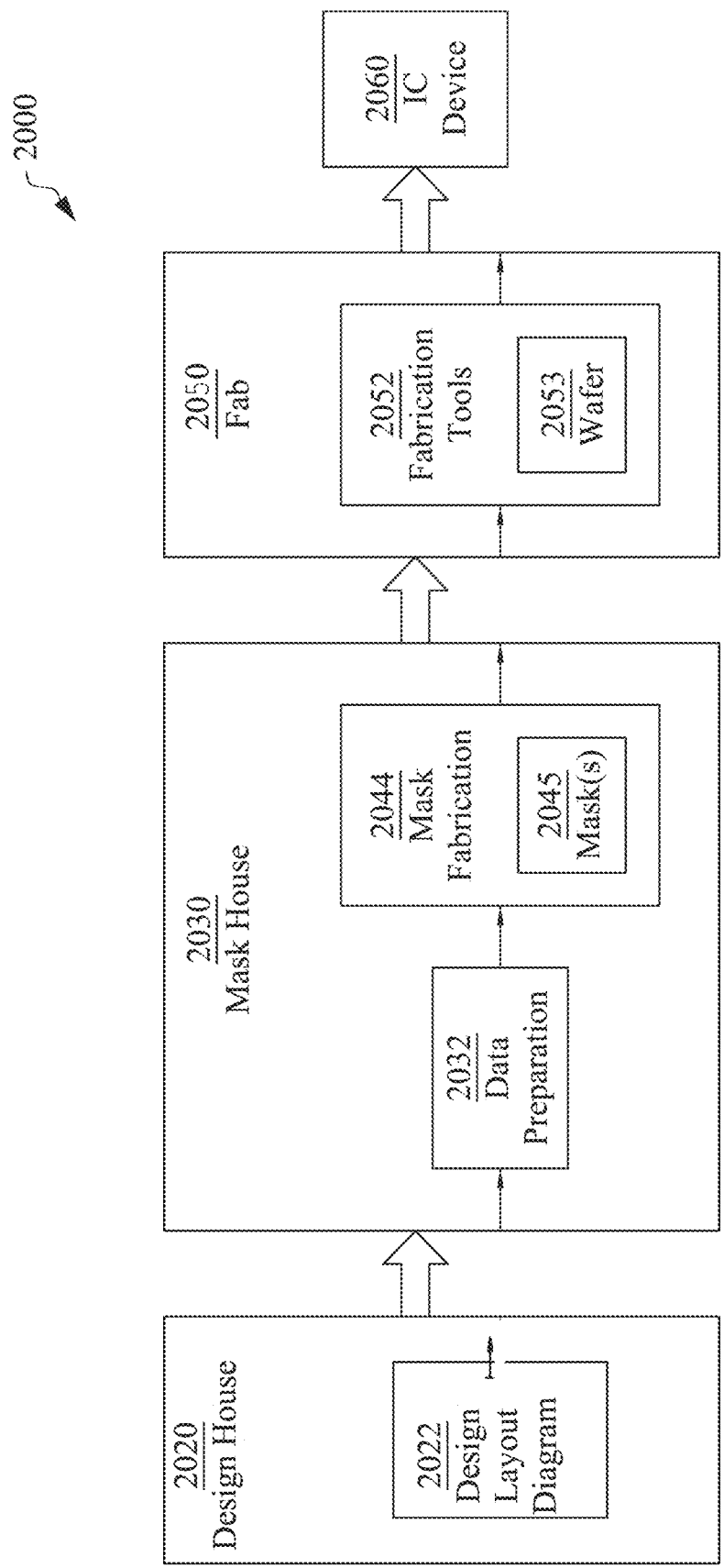
FIG. 20 is a block diagram of an integrated circuit (IC) manufacturing system, and an IC manufacturing flow associated therewith, in accordance with some embodiments.

FIG. 20 is a block diagram of an integrated circuit (IC) manufacturing system 2000, and an IC manufacturing flow associated therewith, in accordance with some embodiments.

In some embodiments, based on a layout diagram, at least one of (A) one or more semiconductor masks or (B) at least one component in a layer of a semiconductor integrated circuit is fabricated using manufacturing system 2000.

In FIG. 20, IC manufacturing system 2000 includes entities, such as a design house 2020, a mask house 2030, and an IC manufacturer/fabricator ("fab") 2050, that interact with one another in the design, development, and manufacturing cycles and/or services related to manufacturing an IC device 2060. The entities in system 2000 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 2020, mask house 2030, and IC fab 2050 is owned by a single larger company. In some embodiments, two or more of design house 2020, mask house 2030, and IC fab 2050 coexist in a common facility and use common resources.

Design house (or design team) 2020 generates an IC design layout diagram 2022. IC design layout diagram 2022 includes various geometrical patterns designed for an IC device 2060. The geometrical patterns correspond to patterns of metal, oxide, or semiconductor layers that make up the various components of IC device 2060 to be fabricated. The various layers combine to form various IC features. For example, a portion of IC design layout diagram 2022 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 2020 implements a proper design procedure to form IC design layout diagram 2022. The design procedure includes one or more of logic design, physical design or place and route. IC design layout diagram 2022 is presented in one or more data files having information of the geometrical patterns. For example, IC design layout diagram 2022 can be expressed in a GDSII file format or DFII file format.

Mask house 2030 includes data preparation 2032 and mask fabrication 2044. Mask house 2030 uses IC design layout diagram 2022 to manufacture one or more masks 2045 to be used for fabricating the various layers of IC device 2060 according to IC design layout diagram 2022. Mask house 2030 performs mask data preparation 2032, where IC design layout diagram 2022 is translated into a representative data file ("RDF"). Mask data preparation 2032 provides the RDF to mask fabrication 2044. Mask fabrication 2044 includes a mask writer. A mask writer converts the RDF to an image on a substrate, such as a mask (reticle) 2045 or a semiconductor wafer 2053. The design layout diagram 2022 is manipulated by mask data preparation 2032 to comply with particular characteristics of the mask writer and/or requirements of IC fab 2050. In FIG. 20, mask data preparation 2032 and mask fabrication 2044 are illustrated as separate elements. In some embodiments, mask data preparation 2032 and mask fabrication 2044 can be collectively referred to as mask data preparation.

In some embodiments, mask data preparation 2032 includes optical proximity correction (OPC) which uses lithography enhancement techniques to compensate for image errors, such as those that can arise from diffraction, interference, other process effects and the like. OPC adjusts IC design layout diagram 2022. In some embodiments, mask data preparation 2032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 2032 includes a mask rule checker (MRC) that checks the IC design layout diagram 2022 that has undergone processes in OPC with a set of mask creation rules which contain certain geometric and/or connectivity restrictions to ensure sufficient margins, to account for variability in semiconductor manufacturing processes, and the like. In some embodiments, the MRC modifies IC design layout diagram 2022 to compensate for limitations during mask fabrication 2044, which may undo part of the modifications performed by OPC in order to meet mask creation rules.

In some embodiments, mask data preparation 2032 includes lithography process checking (LPC) that simulates processing that will be implemented by IC fab 2050 to fabricate IC device 2060. LPC simulates this processing based on IC design layout diagram 2022 to create a simulated manufactured device, such as IC device 2060. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 2022.

It should be understood that the above description of mask data preparation 2032 has been simplified for the purposes of clarity. In some embodiments, data preparation 2032 includes additional features such as a logic operation (LOP) to modify IC design layout diagram 2022 according to manufacturing rules. Additionally, the processes applied to IC design layout diagram 2022 during data preparation 2032 may be executed in a variety of different orders.

After mask data preparation 2032 and during mask fabrication 2044, a mask 2045 or a group of masks 2045 are fabricated based on the modified IC design layout diagram 2022. In some embodiments, mask fabrication 2044 includes performing one or more lithographic exposures based on IC design layout diagram 2022. In some embodiments, an electron-beam (e-beam) or a mechanism of multiple e-beams is used to form a pattern on a mask (photomask or reticle) 2045 based on modified IC design layout diagram 2022. Mask 2045 can be formed in various technologies. In some embodiments, mask 2045 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 2045 includes a transparent substrate (e.g., fused quartz) and an opaque material (e.g., chromium) coated in the opaque regions of the binary mask. In another example, mask 2045 is formed using a phase shift technology. In a phase shift mask (PSM) version of mask 2045, various features in the pattern formed on the phase shift mask are configured to have proper phase difference to enhance the resolution and imaging quality. In various examples, the phase shift mask can be attenuated PSM or alternating PSM. The mask(s) generated by mask fabrication 2044 is used in a variety of processes. For example, such a mask(s) is used in an ion implantation process to form various doped regions in semiconductor wafer 2053, in an etching process to form various etching regions in semiconductor wafer 2053, and/or in other suitable processes.

IC fab 2050 includes fabrication tools 2052 configured to execute various manufacturing operations on semiconductor wafer 2053 such that IC device 2060 is fabricated in accordance with the mask(s), e.g., mask 2045. In various embodiments, fabrication tools 2052 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 2050 uses mask(s) 2045 fabricated by mask house 2030 to fabricate IC device 2060. Thus, IC fab 2050 at least indirectly uses IC design layout diagram 2022 to fabricate IC device 2060. In some embodiments, semiconductor wafer 2053 is fabricated by IC fab 2050 using mask(s) 2045 to form IC device 2060. In some embodiments, the IC fabrication includes performing one or more lithographic exposures based at least indirectly on IC design layout diagram 2022. Semiconductor wafer 2053 includes a silicon substrate or other proper substrate having material layers formed thereon. Semiconductor wafer 2053 further includes one or more of various doped regions, dielectric features, multi-level interconnects, and the like (formed at subsequent manufacturing steps).

Details regarding an integrated circuit (IC) manufacturing system (e.g., system 2000 of FIG. 20), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiment, a semiconductor device, includes: a semiconductor substrate including one or more active semiconductor components, wherein a front side is defined over the semiconductor substrate and a back side is defined beneath the semiconductor substrate; a first front side power rail at the front side of the semiconductor substrate, the first front side power rail being configured to receive a first reference power voltage; and a first back side power rail and a second back side power rail at the back side of the semiconductor substrate; the first hack side power rail being configured to receive a second reference power voltage; and the second back side power rail being configured to receive a third reference power voltage; and wherein the first reference power voltage, the second reference power voltage, and the reference power voltage are different from each other.

In some embodiments, the semiconductor device further includes a first front side metal layer at the front side, wherein the first front side metal layer includes first front side power rail and the second front side power rail. In some embodiments, the semiconductor device further includes a first back side metal layer at the back side, wherein the first back side metal layer includes first back side power rail and the second back side power rail. In some embodiments, the semiconductor device further includes a third back side power rail at the back side; a fourth back side power rail at the back side; a fifth back side power rail at the back side; wherein: the first back side power rail, the second back side power rail, the third back side power rail, the fourth back side power rail, and the fifth back side power rail each correspondingly extends in a first direction; the third back side power rail is configured to receive the third reference power voltage; the fourth back side power rail is configured to receive the first reference power voltage; the fourth back side power rail being between the second back side power rail and the third hack side power rail relative to the first direction. In some embodiments, the semiconductor device further includes a fifth back side power rail at the back side, wherein the fifth back side power rail is configured to receive the second reference power voltage and the fifth back side power rail extends in the first direction; wherein the second back side power rail, the third back side power rail, and the fourth back side power rail are between the first hack side power rail and the fifth back side power rail relative to a second direction that is substantially perpendicular to the first direction. In some embodiments, the first reference power voltage is true VDD (TVDD); the second reference power voltage is virtual VDD (VVDD); and the third reference power voltage is VSS. In some embodiments, the semiconductor device further includes a first dual-mode cell region; a first single-mode cell region; wherein: each of the second hack side power rail, the third back side power rail, and the fourth back side power rail is at least partially aligned relative to the second direction; a top portion of the first dual-mode cell region relative to the second direction at least partially overlaps the first back side power rail; a bottom portion of the first dual-mode cell region relative to the second direction at least partially overlaps the second back side power rail, the third back side power rail, and the fourth back side power rail; a top portion of the first single-mode cell region relative to the second direction at least partially overlaps the second hack side power rail, the third back side power rail, and the fourth back side power rail; a bottom portion of the first single-mode cell region relative to the second direction at least partially overlaps the fifth back side power rail. In some embodiments, the semiconductor device further includes a first header cell region; wherein: a top portion of the first header cell region relative to the second direction partially overlaps the first hack side power rail; a bottom portion of the first header cell region relative to the second direction partially overlaps the fifth back side power rail. In some embodiments, the semiconductor device further includes a plurality of front side power rails that includes the first front side power rail; a front side conduction line; wherein: each of the plurality of front side power rails correspondingly extends in a first direction; the front side conduction line extends in the first direction; the front side conduction line is configured to receive a control signal; some of the plurality of front side power rails are configured to receive the first reference power voltage; another some of the plurality of front side power rails are configured to receive the second reference power voltage; the front side conduction line is aligned relative to the second direction with the second back side power rail, the third back side power rail, and the fourth back side power rail; and the front side conduction line being between a first set of the plurality of front side power rails and a second set of the plurality of front side power rails relative to the second direction. In some embodiments, the semiconductor device further includes: a third back side power rail at the back side; wherein: the third back side power rail is configured to receive the second reference power voltage; the first back side power rail, the second back side power rail, and the third back side power rail each extend in a first direction; the second back side power rail is between the first hack side power rail and the third hack side power rail relative to a second direction that is substantially perpendicular to the first direction. In some embodiments, the semiconductor device further includes cell regions that abut one another; a power filler region; a plurality of front side power rails at the front side that extend over the cell regions and the power filler region; the first back side power rail, the second back side power rail, and the third back side power rail each extend beneath the cell regions and the power filler region; wherein: a first set of the cell regions extend relative to the second direction so that a top portion of the first set of the cell regions relative to the second direction is partially aligned with the first back side power rail and a bottom portion of the first set of the cell regions is partially aligned with the second back side power rail; a second set of the cell regions extend relative to the second direction so that a top portion of the second set of the cell regions relative to the second direction is partially aligned with the second back side power rail and a bottom portion of the second set of the cell regions is partially aligned with the third back side power rail; the plurality of front side power rails connect to the first back side power rail, the second back side power rail, and the third back side power rail in the power filler region. In some embodiments, the semiconductor device further includes a first cell region that extends relative to the second direction so that a top portion of the first cell region extend relative to the second direction so that a top portion of the first cell region relative to the second direction is partially aligned with the first back side power rail and a bottom portion of the first cell region is partially aligned with the second back side power rail; a second cell region that extends relative to the second direction so that a top portion of the second cell region relative to the second direction is partially aligned with the second back side power rail and a bottom portion of the second cell region is partially aligned with the third back side power rail; a plurality of front side power rails that includes the first front side power rail; a front side conduction line; wherein: each of the plurality of front side power rails extends in a first direction; the front side conduction line extends in the first direction; the front side conduction line is configured to receive a control signal; some of the plurality of front side power rails are configured to receive the first reference power voltage; some of the plurality of front side power rails is configured to receive the second reference power voltage; the front side conduction line is aligned relative to the second direction with the second back side power rail, the third back side power rail, and the fourth hack side power rail; and the front side conduction line being between a first set of the plurality of front side power rails and a second set of the plurality of front side power rails relative to the second direction. In some embodiments, the first reference power voltage is true VDD (TVDD); the second reference power voltage is virtual VDD (VVDD); and the third reference power voltage is VSS. In some embodiments, the first reference power voltage is virtual VDD (VVDD); the second reference power voltage is true VDD (TVDD); and the third reference power voltage is VSS.

In some embodiments, a semiconductor device, includes: a semiconductor substrate including one or more active semiconductor components, wherein a front side is defined over the semiconductor substrate and a back side is defined beneath the semiconductor substrate; a first back side power rail, a second back side power rail, and a third back side power rail at the back side of the semiconductor substrate; and wherein: the first back side power rail is configured to receive a first reference power voltage; the second back side power rail is configured to receive a second reference power voltage; the third back side power rail is configured to receive a third reference power voltage, wherein the first reference power voltage, the second reference power voltage, and the third reference power voltage are different from each other. In some embodiments, a semiconductor device, further includes: a first back side metal layer at the back side, wherein the first back side metal layer includes first back side power rail and the second back side power rail. In some embodiments, the second back side power rail is configured to receive the third reference power voltage and wherein the semiconductor device further includes: a fourth back side power rail at the back side; a fifth back side power rail at the back side; the first hack side power rail, the second back side power rail, the third hack side power rail, the fourth back side power rail, and the fifth back side power rail each extend in a first direction; the third back side power rail is configured to receive the third reference power voltage; the fourth back side power rail is configured to receive the first reference power voltage; the fourth back side power rail being between the second back side power rail and the third back side power rail relative to the first direction. In some embodiments, a semiconductor device, further includes: a fifth back side power rail at the back side, wherein the fifth hack side power rail is configured to receive the second reference power voltage and the fifth back side power rail each extends in the first direction; wherein the second back side power rail, the third back side power rail, and the fourth back side power rail are between the first back side power rail and the fifth back side power rail relative to a second direction that is substantially perpendicular to the first direction.

In some embodiments, a method (of fabricating a semiconductor device) includes: providing a semiconductor substrate having a first active region and a second active region that correspondingly extend in a first direction; configuring the first active region to have a first conductivity; configuring the second active regions to have a second conductivity; a front side being defined over the semiconductor substrate and a back side being defined beneath the semiconductor substrate; forming a first front side conductive line at the front side configuring the first front side conductive line to receive an input signal or provide an output signal; forming a first front side power rail at the front side; configuring the first front side power rail to receive a first reference power voltage; forming a first back side power rail at the back side; configuring the first back side power rail to receive a second reference power voltage; forming a first gate electrode at the front side, the first gate electrode extending in a second direction that is substantially orthogonal to the first direction, the first gate electrode defining a first drain/source region and a second drain/source region in the first active region and a third drain/source region and fourth drain/source region in the second active region; connecting the first gate electrode to the first front side conductive line; connecting the first drain/source region or the second drain/source region to the first front side power rail; and connecting the third drain/source region or the fourth drain/source region to the first back side power rail. In some embodiments, the first reference power voltage is true VDD (TVDD); the second reference power voltage is virtual VDD (VVDD); and the third reference power voltage is VSS.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a semiconductor substrate including one or more active semiconductor components wherein a front side is defined over the semiconductor substrate and a back side is defined beneath the semiconductor substrate;
   a first front side power rail in a first front side metal layer at the front side of the semiconductor substrate, the first front side power rail being configured to receive a first reference power voltage; and
   a first back side power rail, a second back side power rail, a third back side power rail and a fourth back side power rail in a first back side metal layer at the back side of the semiconductor substrate and each extending in a first direction;
   the first back side power rail being configured to receive a second reference power voltage;
   the second back side power rail being configured to receive a third reference power voltage;
   each of the third and fourth back side power rails being configured to receive the first reference power voltage;
   within a span of a first cell that is defined relative to the first direction,
      the second back side power rail being between the third and the fourth back side power rails relative to the first direction;
      relative to a second direction that is substantially perpendicular to the first direction, the first front side power rail at least partially overlapping the third back side power rail and the fourth back side power rail; and
   the first reference power voltage, the second reference power voltage, and the third reference power voltage being different from each other.

2. The semiconductor device of claim 1, further comprising:
   a first front side metal layer at the front side, wherein the first front side metal layer includes the first front side power rail and a second front side power rail.

3. The semiconductor device of claim 1, further comprising:
   a fifth back side power rail in the first back side metal layer and that extends in the first direction; and
   wherein:
      the fifth back side power rail is configured to receive the second reference power voltage,
      the second back side power rail, the third back side power rail, and the fourth back side power rail are between the first back side power rail and the fifth back side power rail relative to the second direction, and
      relative to the second direction, the second back side power rail at least partially overlaps the third back side power rail and the fourth back side power rail.

4. The semiconductor device of claim 3, wherein:
   the third reference power voltage is true VDD (TVDD);
   the second reference power voltage is virtual VDD (VVDD); and
   the first reference power voltage is VSS.

5. The semiconductor device of claim 4, wherein:
   the first cell is a first dual-mode cell;
   each of the second back side power rail, the third back side power rail, and the fourth back side power rail is at least partially aligned relative to the second direction;
   a top portion of the first dual-mode cell relative to the second direction at least partially overlaps the first back side power rail;
   a bottom portion of the first dual-mode cell relative to the second direction at least partially overlaps the second back side power rail, the third back side power rail, and the fourth back side power rail;
   a top portion of a first single-mode cell relative to the second direction at least partially overlaps the second back side power rail, the third back side power rail, and the fourth back side power rail; and
   a bottom portion of the first single-mode cell relative to the second direction at least partially overlaps the fifth fourth back side power rail.

6. The semiconductor device of claim 4, further comprising:
   a first header cell; and
   wherein:
      a top portion of the first header cell relative to the second direction partially overlaps the first back side power rail; and
      a bottom portion of the first header cell relative to the second direction partially overlaps the fifth back side power rail.

7. The semiconductor device of claim 6, further comprising:
   a plurality of front side power rails that includes the first front side power rail; and
   a front side conduction line; and
   wherein:
      each of the plurality of front side power rails correspondingly extends in the first direction;
      the front side conduction line extends in the first direction;

the front side conduction line is configured to receive a control signal;

some of the plurality of front side power rails are configured to receive the first reference power voltage;

some of the plurality of front side power rails are configured to receive the second reference power voltage;

the front side conduction line is aligned relative to the second direction with the second back side power rail, the third back side power rail, and the fourth back side power rail; and the front side conduction line is between a first set of the plurality of front side power rails and a second set of the plurality of front side power rails relative to the second direction.

8. The semiconductor device of claim 1, further comprising:

cells that abut one another;

a power filler region; and a plurality of front side power rails at the front side including the first front side power rail that extend over the cells and the power filler region; and wherein:

the first back side power rail, the second back side power rail, and the third back side power rail each extend beneath the cells and the power filler region; and a first set of the cells extend relative to the second direction so that a top portion of the first set of the cells relative to the second direction is partially aligned with the first back side power rail and a bottom portion of the first set of the cells is partially aligned with the second back side power rail;

a second set of the cells extend relative to the second direction so that a top portion of the second set of the cells relative to the second direction is partially aligned with the second back side power rail and a bottom portion of the second set of the cells is partially aligned with the third back side power rail; and the plurality of front side power rails correspondingly connect to the first back side power rail, the fourth back side power rail, and the third back side power rail in the power filler region.

9. The semiconductor device of claim 1, further comprising:

a first cell that extends relative to the second direction so that a top portion of the first cell extends relative to the second direction so that a top portion of the first cell relative to the second direction is partially aligned with the first back side power rail and a bottom portion of the first cell is partially aligned with the second back side power rail;

a second cell that extends relative to the second direction so that a top portion of the second cell relative to the second direction is partially aligned with the second back side power rail and a bottom portion of the second cell is partially aligned with the third back side power rail;

a plurality of front side power rails that include the first front side power rail; and a front side conduction line; and wherein:

each of the plurality of front side power rails extends in the first direction; the front side conduction line extends in the first direction;

the front side conduction line is configured to receive a control signal;

some of the plurality of front side power rails are configured to receive the first reference power voltage;

some of the plurality of front side power rails are configured to receive the second reference power voltage;

the front side conduction line is aligned relative to the second direction with the second back side power rail and the third back side power rail; and the front side conduction line is between a first set of the plurality of front side power rails and a second set of the plurality of front side power rails relative to the second direction.

10. The semiconductor device of claim 9, wherein:

the third reference power voltage is true VDD (TVDD);

the second reference power voltage is virtual VDD (VVDD); and the first reference power voltage is VSS.

11. The semiconductor device of claim 9, wherein:

the third reference power voltage is virtual VDD (VVDD);

the second reference power voltage is true VDD (TVDD); and the first reference power voltage is VSS.

12. A semiconductor device, comprising:

a semiconductor substrate including one or more active semiconductor components, wherein a front side is defined over the semiconductor substrate and a back side is defined beneath the semiconductor substrate; and a first back side power rail, a second back side power rail, a third back side power rail and a fourth back side power rail in a first back side metal layer at the back side of the semiconductor substrate and each extending in a first direction; and wherein:

the first back side power rail is configured to receive a first reference power voltage;

the second back side power rail is configured to receive a second reference power voltage;

each of the third and fourth back side power rails is configured to receive a third reference power voltage;

within a span of a first cell that is defined relative to the first direction, the second back side power rail is between the third and fourth back side power rails relative to the first direction; and the first reference power voltage, the second reference power voltage, and the third reference power voltage are different from each other.

13. The semiconductor device of claim 12, further comprising:

a fifth back side power rail in the first back side metal layer and that extends in the first direction; and wherein:

the fifth back side power rail is configured to receive the second reference power voltage, the second back side power rail, the third back side power rail, and the fourth back side power rail are between the first back side power rail and the fifth back side power rail relative to a second direction that is substantially perpendicular to the first direction, and relative to the second direction, the second back side power rail at least partially overlaps the third back side power rail and the fourth back side power rail.

14. A method of fabricating a semiconductor device, the method comprising:
providing a semiconductor substrate having a first active region and a second active region that correspondingly extend in a first direction;
configuring the first active region to have a first conductivity;
configuring the second active region to have a second conductivity;
a front side being defined over the semiconductor substrate and a back side being defined beneath the semiconductor substrate;
forming a first front side conductive line at the front side;
configuring the first front side conductive line to receive an input signal or provide an output signal;
forming a first front side power rail in a first front side metal layer at the front side;
configuring the first front side power rail to receive a first reference power voltage;
forming a first back side power rail, a second back side power rail, a third back side power rail and a fourth back side power rail in a first back side metal layer at the back side of the semiconductor substrate and each extending in the first direction, the forming including:
within a span of a first cell that is defined relative to the first direction,
locating the second back side power rail between the third and fourth back side power rails relative to the first direction; and
locating, relative to a second direction that is substantially perpendicular to the first direction, the third back side power rail and the fourth back side power rail to at least partially overlap the first front side power rail;
configuring the first back side power rail to receive a second reference power voltage;
configuring the second back side power rail to receive a third reference power voltage;
configuring each of the third and fourth back side power rails to receive the first reference power voltage,
the first reference power voltage, the second reference power voltage, and the third reference power voltage being different from each other;
forming a first gate electrode at the front side, the first gate electrode extending in the second direction;
arranging the first gate electrode to define a first drain/source region and a second drain/source region in the first active region and a third drain/source region and a fourth drain/source region in the second active region;
connecting the first gate electrode to the first front side conductive line;
connecting the first drain/source region or the second drain/source region to the first front side power rail; and
connecting the third drain/source region or the fourth drain/source region to the first back side power rail.

15. The method of claim 14, wherein:
the third reference power voltage is true VDD (TVDD);
the second reference power voltage is virtual VDD (VVDD); and
the first reference power voltage is VSS.

16. The semiconductor device of claim 1, wherein
within a span of a second cell that is defined relative to the first direction,
the second back side power rail is between the third and the fourth back side power rails relative to the first direction.

17. The semiconductor device of claim 16, wherein
relative to the second direction, each of the second, third and fourth back side power rails is:
at least partially overlapped by a bottom portion of the first cell; and
at least partially overlapped by a top portion of the second cell.

18. The semiconductor device of claim 12, wherein
within a span of a second cell that is defined relative to the first direction,
the second back side power rail is between the third and the fourth back side power rails relative to the first direction.

19. The semiconductor device of claim 18, wherein
relative to a second direction that is substantially perpendicular to the first direction, each of the second, third and fourth back side power rails is:
at least partially overlapped by a bottom portion of the first cell; and
at least partially overlapped by a top portion of the second cell.

20. The method of claim 14, wherein:
within a span of a second cell that is defined relative to the first direction,
locating the second back side power rail between the third and fourth back side power rails relative to the first direction.

* * * * *